United States Patent [19]
Asahi et al.

[11] Patent Number: 5,601,737
[45] Date of Patent: Feb. 11, 1997

[54] SURFACE TREATING PROCESS INVOLVING ENERGY BEAM IRRADIATION ONTO MULTILAYERED CONDUCTOR PARTS OF PRINTED CIRCUIT BOARD

[75] Inventors: Nobuyuki Asahi; Jun Tatsuta, both of Kadoma, Japan

[73] Assignee: Matsushita Electric Works, Ltd., Osaka, Japan

[21] Appl. No.: 268,168

[22] Filed: Jun. 29, 1994

[30] Foreign Application Priority Data

Jul. 27, 1993 [JP] Japan ................................. 5-007294
Jul. 27, 1993 [JP] Japan ................................. 5-082119

[51] Int. Cl.⁶ ........................... B23K 26/00; B23K 26/12
[52] U.S. Cl. ............................... 219/121.66; 219/121.85; 219/121.84; 219/121.83; 437/174; 427/554
[58] Field of Search ................. 219/121.64, 121.65, 219/121.66, 121.83, 121.68, 121.73, 121.75, 121.84, 121.85; 427/554, 555; 437/174, 175

[56] References Cited

U.S. PATENT DOCUMENTS

| | | |
|---|---|---|
| 4,278,867 | 7/1981 | Tan ..................................... 219/121.66 |
| 4,348,263 | 9/1982 | Draper et al. ........................... 204/29 |
| 4,476,150 | 10/1984 | Rose ........................................ 427/10 |
| 4,832,798 | 5/1989 | Cvijanonch et al. ................... 427/53.1 |
| 4,898,650 | 2/1990 | Wu et al. ................................. 204/29 |
| 5,023,407 | 6/1991 | Shirai et al. . |
| 5,332,879 | 7/1994 | Radhakrishnan et al. ......... 219/121.69 |
| 5,368,911 | 11/1994 | Mannava et al. ...................... 427/269 |
| 5,424,508 | 6/1995 | Swain et al. ....................... 219/121.84 |
| 5,473,136 | 12/1995 | Engelhardt et al. ............... 219/121.62 |
| 5,491,319 | 2/1996 | Economikos et al. ............. 219/121.69 |

FOREIGN PATENT DOCUMENTS 0144013  9/1980  Japan ............................... 219/121.73

Primary Examiner—Mark H. Paschall
Attorney, Agent, or Firm—Burns, Doane, Swecker & Mathis, L.L.P.

[57] ABSTRACT

A surface treating process with respect to conductor parts on printed circuit board irradiates an energy beam onto the surface of the conductor parts each in a plurality of layers of different, single metal material, with the intensity, dosage and the like optimumly set and under such irradiating conditions that the respective metal material of the conductor parts do not form any mutual alloy, and the surface of the conductor parts on the printed circuit board can be thereby excellently treated as desired.

42 Claims, 23 Drawing Sheets

SURFACE TREATING PROCESS INVOLVING ENERGY BEAM IRRADIATION ONTO MULTILAYERED CONDUCTOR PARTS OF PRINTED CIRCUIT BOARD

BACKGROUND OF THE INVENTION

This invention relates to a surface treating process carried out for the purpose of improving the characteristics of conductor parts on printed circuit board.

The printed circuit board of the type referred to is of a structure in which the conductor parts formed with metal materials on the surface, as in the case of a semiconductor package, are utilized for electrically interconnecting between semiconductor chips and external connection terminals or the like in excellent manner, to be useful enough.

DESCRIPTION OF RELATED ART

In various conventional semiconductor package products known as PGA (Pin Grid Array), QFP (Quard Flat Package), COB (Chip On Board) and the like, it has been attempted to attain electrical junction mutually between respective electronic parts or between the electronic parts and external circuit, by forming the conductor parts with metal material layers of copper, gold or the like on the printed circuit board formed by a plastic material or the like, and electrically contacting such various electronic parts as the semiconductor chip or the like with the conductor parts. On the other hand, such conductor parts formed on the printed circuit board for use in the semiconductor package products require an extremely fine and precise working for being adapted to the semiconductor chips, and is demanded to have en extremely high electric characteristics in view of very weak current or high frequency current made to flow therethrough.

In manufacturing the printed circuit board, however, there have been involving such risks that, as being subjected to an affection or various undesirable action of ambient atmosphere during a variety of manufacturing steps, the surface of the conductor parts on the printed circuit board is contaminated, subjected to a metallic inactivation, made to show increments in the insulation resistance, or caused to show decrements in the reliability in the electrical junction. The decrement in the reliability in respect of the conductor part surface may give to the characteristics of the whole printed circuit board a remarkable damage.

In order to eliminate these problems, there have been suggested various measures for improving the reliability in respect of the conductor part surface by carrying out a washing of the printed circuit board, a modification of the conductor surface or the like. For the washing, here, a wet type chemical process employing such chemical agent as a FURON (a trademark) has been generally practiced, but the use of FURON has been regarded as being detrimental to global environment in recent years, and it has been necessary to perform the washing without using FURON. For the washing without using FURON, there has been provided a measure employing qua pura, or a measure using a surface-active agent.

According to these washing process, on the other hand, there has been a problem that it has been difficult to remove completely contaminated substance present on the conductor surface. It has been another problem that washing agent remains on the conductor surface to impair the characteristics of the conductor parts. Further, when the presence of the contaminated substance is attached by a mere adhesion to the conductor surface, its removal is easy. In an event where the conductor surface has been inactivated, there remains a problem that the above described washing process is unable to restore the reliability in the electric connection.

Now, in place of the foregoing wet type washing process, there has been suggested in recent years a dry type surface treating process in which such energy beam as a laser beam is irradiated onto the conductor surface for removing the contaminated substance or restoring the metallic activity of the conductor surface. There has been also suggested a measure involving irradiating the laser beam on a conductor part consisting of a plurality of layers of different metal materials to form an alloy layer excellent for a solder moistening of the surface. A dry type surface treating process of this type has been described in, for example, U.S. Pat. No. 5,023,407 of M. Shirai et al.

Even with such a dry type surface treating process, however, there remains a problem that the reliability in the electrical junction at the conductor surface still has not reached a satisfiable level. More specifically there arises a problem that the irradiation of the energy beam onto a resin part or the like adjacent to the conductor parts causes part of the resin to scatter and the thus scattered resin adheres to the conductor surface to contaminate it. Further, in the known process of forming the alloy layer by the irradiation of the laser beam on a conductor surface formed of different metal materials, there arises a problem that an intermetallic compound is caused to be formed between the different metal material layers, so as to increase the resistance value of the entire conductor part and the electrical junction of the conductor part is eventually deteriorated. Further, when a sufficiently large laser input calorie for forming the alloy layer is provided, an unnecessary heat affection is given to parts of the substrate other than the conductor part to vary the characteristics of the non-conductor part varied; the insulation resistance between the conductor metal layers is thereby deteriorated, and the electric reliability of the entire circuit is caused to be poor.

SUMMARY OF THE INVENTION

A primary object of the present invention is, therefore, to eliminate the foregoing problems of the known dry type surface treating process employing the energy beam, and to provide a surface treating process for conductor parts on the printed circuit board and a suitable printed circuit board therefor which are capable of improving the reliability in respect of the electrical surface junction with respect to the conductor parts on the printed circuit board, without causing other characteristics of the conductor parts to be impaired or without giving any undesirable affection to other parts than the conductor parts.

According to the present invention, the above object can be realized by means of a surface treating process for conductor parts on the printed circuit board wherein an energy beam is irradiated onto the surface of the conductor parts formed as a laminate of a plurality of metal materials on a substrate made from an organic material, characterized in that the energy beam is irradiated under such irradiating conditions that the conductor parts are subjected to the surface treatment without forming any alloy between the top layered metal material layer and any other metal material layer in the laminate.

In the process referred to above, the energy beam is irradiated onto the surface of the conductor parts on the printed circuit board with the intensity, dose and the like of the energy beam optimumly set, so that only the surface layer of the conductor parts will be momentarily fused. Thus, any contamination substance of an organic substance or the like present on the surface of the conductor parts will be thereby removed as by being evaporated, any gas adsorbed to the surface of the conductor parts can be released, and fine holes produced in surface layer of the metal during its plating are filled up at the time of the fusion of the surface layer so as to realize a surface smoothing.

Other objects and advantages of the present invention shall become clear as following description of the invention advances as detailed with reference to preferred embodiments shown in accompanying drawings.

BRIEF DESCRIPTION OF THE DRAWINGS

FIGS. 18 through 21A are explanatory views for still further and different embodiments according to the present invention;

DETAILED DESCRIPTION OF THE PREFERRED EMBODIMENTS

In the present invention, when the energy beam is irradiated onto the surface of the conductor parts on the printed circuit board, only the surface portion of the conductor parts is momentarily heated and, i.e., melted, any contaminated substance consisting of an organic substance existing on the surface of the conductor parts is removed as evaporated, and any gas adsorbed to the surface of the conductor parts is also removed.

In this case, the energy beam of an excessively high intensity is likely to cause undesirably an alloy to be formed between the topmost one and at least the next one of the respective layers of the different metal materials forming the conductor part. Once such alloy is formed, the electric resistance value of the entire conductor parts is thereby lowered, and the present invention adopts an arrangement capable of reliably preventing such alloy from being formed. Further, since the irradiation of the energy beam onto the conductor surface is likely to cause constituent material of the printed circuit board to be scattered, it is required to effectively prevent the constituent material of the board from scattering by properly setting the intensity of the energy beam in view of this respect.

The irradiating conditions of the energy beam with respect to the conductor parts are initially based on the thickness of the metal material layer at the surface of the conductor parts and the characteristics of the metal material including the thermal conductivity and threshold value with respect to the energy beam, and are set with at least one of the wave length of the energy beam, energy density, the number of shot, irradiating time, pulse width and peak power, as a parameter.

For the energy beam used for the irradiation, a laser beam, in particular, an EXIMER layer is desirable, while such other lasers than the EXIMER laser as YAG laser, $CO_2$ laser and the like may also be employed.

Figure 1A:
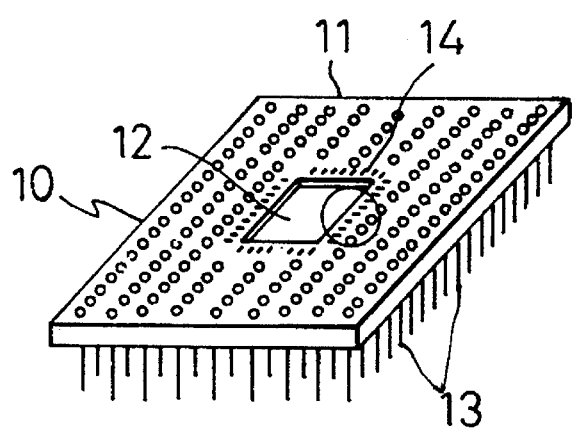
FIG. 1A shows in a perspective view, with a part shown as magnified, a printed circuit board with respect to which the surface treating process for the conductor parts is to be executed.
Figure 1C:
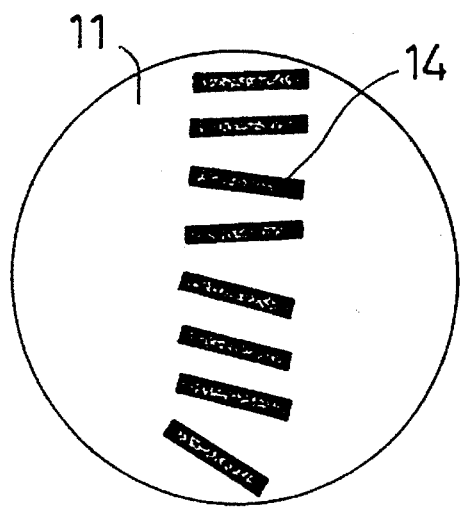
FIG. 1C is an enlarged view of a portion of FIG. 1A.
Figure 1B:
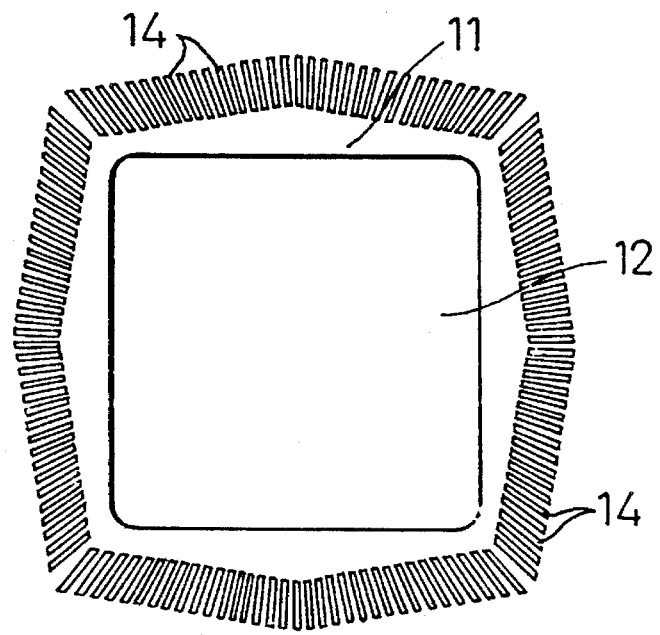
FIG. 1B is a fragmentary plan view as magnified of the board shown in FIG. 1A.

Referring to a specific arrangement with reference to the drawings, FIGS. 1A and 1B show a PGA substrate, in which a rectangular plate shaped substrate 11 made of a modified polyimide resin is formed to have a cavity 12 formed in its top center as a rectangular recess, and a semiconductor chip (not shown) is to be mounted in this cavity 12. On a lower surface of the substrate 11, there are a large number of terminal pins 13 planted substantially over the entire surface, and these terminal pins 13 are to be inserted into corresponding terminal holes provided in another substrate or the like (not shown) for attaining electrical connection. Further, the terminal pins 13 are connected to a conductor circuit formed inside, or on upper surface, of the substrate 11. On the upper surface of the substrate 11 and along four peripheral sides of the rectangular cavity 12, a large number of conductive inner leads 14 of small strip shape are provided, and these inner leads 14 are connected also to the conductor circuit to which the terminal pins 13 are connected. The semiconductor chip mounted to the cavity 12 is connected at respective terminals of the chip to corresponding ones of the inner leads 14, while these inner leads 14 constitute the conductor parts formed by the metal material layers, and the printed circuit board 10 is thus formed.

Figure 2A:
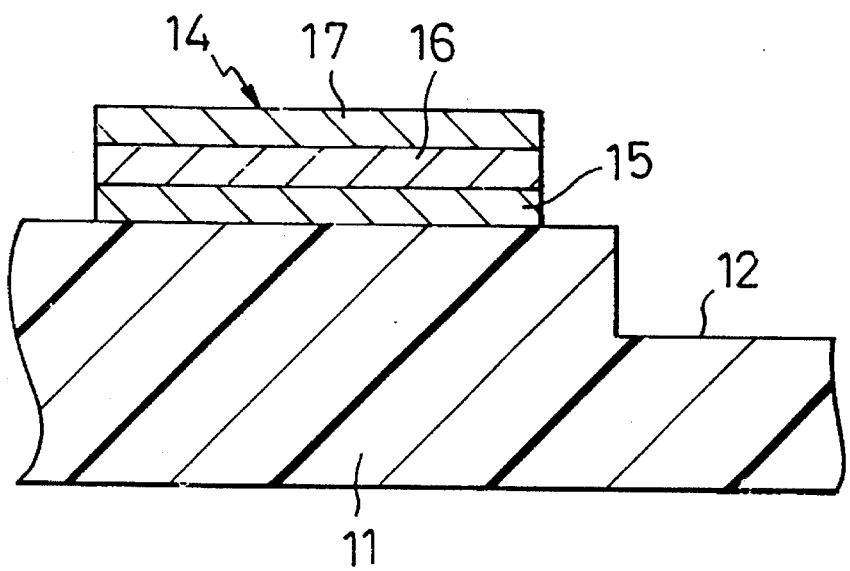
FIG. 2A is a fragmentary sectioned view as magnified in a state prior to the surface treating of the printed circuit board of FIG. 1.
Figure 2B:
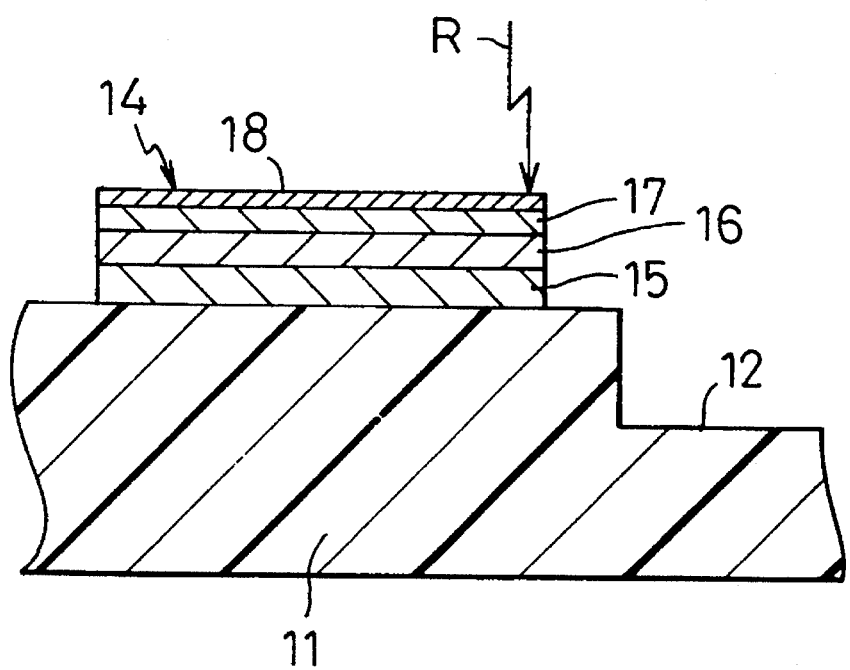
FIG. 2B is a fragmentary sectioned view as magnified in a state after the surface treating also of the printed circuit board of FIG. 1.

Referring next to FIG. 2A, the inner leads, that is, the conductor parts 14 and an adjacent portion of the board are shown, in which each conductor part 14 is formed as a laminate of a copper foil 15 glued onto the substrate 11 of the printed circuit board 10, and nickel and gold (noble metal) layers 16 and 17 plated on the copper foil 15. Thus, the topmost layer, that is, the surface of the respective conductor parts 14 formed on the substrate 11 is the gold layer 17, which layer is formed in a thickness of about several μm. Here, as shown in FIG. 2B, an energy beam in the form of a KrF EXIMER laser R (wave length λ=248 nm) is irradiated onto the surface of the conductor part 14 on the substrate 11. The irradiation of the laser beam R is so performed as to scan an elongated area including a zone in which many of the conductor parts 14 are disposed in an array, and the laser beam R is caused to be irradiated onto a surface of the substrate 11 around the conductor parts 14 and between the respective conductor parts 14 in the array, to some extent. In irradiating the laser beam R, its energy density was regulated within a range of about 0.5 to 3.0 J/cm$^2$, and irradiating shot number was also adjusted in a range of 1 to 10 shots. The irradiation was repeated with the energy density and shot number varied, and irradiating conditions allowing the best obtainable surface treating effect to be recognized.

In consequence, it has been found that an excellent result in respect of the characteristics of the conductor parts 14 was obtained when such sectional structure as shown in FIG. 2B was obtained. That is, within the gold layer 17 of the conductor part 14, the topmost surface layer part 18 once fused (i.e., melted) by the laser beam R is in a state of being cooled and hardened, and the gold layer 17 is divided into: (i) a non-fused layer portion in which the gold layer 17 remains unchanged, and (ii) the once-fused gold layer portion 18. In this case, the fusing action of the laser beam R irradiated does not reach the nickel layer 16 immediately below the gold layer 17, and no alloy is formed between the gold layer 17 and the nickel layer 16 because of the presence of the non-fused lower portion of the gold layer 17. Further, while it has been recognized that the surface of the conductor part 14 prior to the surface treating as in FIG. 2A possessed a minute undulation the surface treating has resulted in that the minute undulation has substantially disappeared, and the conductor surface was smooth.

Figure 3:
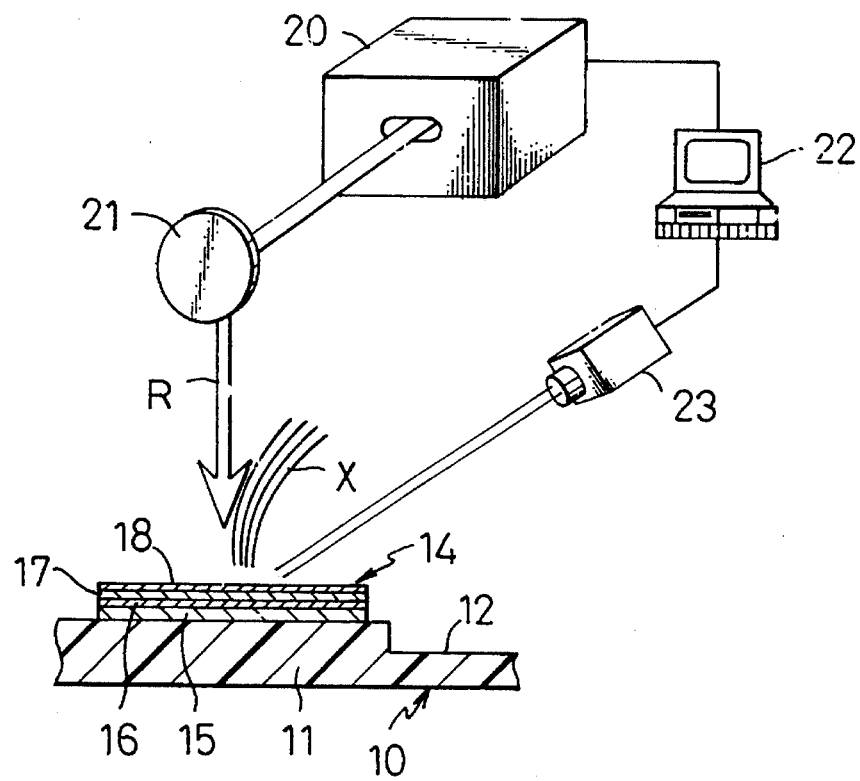
FIG. 3 is an explanatory view for an embodiment of an arrangement used in performing the surface treating of the conductor parts according to the present invention.

Referring next to FIG. 3, there is shown an arrangement in an embodiment of the present invention for carrying out the irradiation of the energy beam R with respect to the surface of the conductor part 14 on the substrate. 11 forming the printed circuit board 10 while observing the state of the surface of the conductor part 14. In this embodiment, the laser beam R irradiated from a laser irradiating means 20 is once reflected on a mirror 21 and is then irradiated to the surface of the conductor part 14 on the substrate 11, upon which the contamination substance X and the like can be removed from the surface of the conductor part 14, and such surface state of the conductor part 14 is monitored by means of a CCD camera 23 connected to a control means 22 including a computer. Therefore, an image taken by the CCD camera 23 is input into the control means 22 as electronic information. At this control means 22, the information on the image taken is subjected to an analysis, and an oscillation circuit or the like of the laser irradiating means 20 is subjected to a feedback control on the basis of the result of the analysis.

More specifically, the state of melting in which the surface of the conductor part 14 changes surface luster is caught, and the irradiated energy density or shot number of the laser beam R is modified and regulated at the laser irradiating means 20 so as not to be excessive. To observe the change in the surface luster, the reflectance of the surface is measured. The use of a reflectance meter in place of the CCD camera may result in an obtainment of the same function as that of the CCD camera-. Further, it is possible to know the state of fusion at the surface from variation in surface color of the conductor part 14, and the control means 22 may include a chromoscope. Thus, it becomes possible to perform a more precise control when the reflectance and color are collectively observed together with the image by means of the CCD camera 23.

Figure 4:
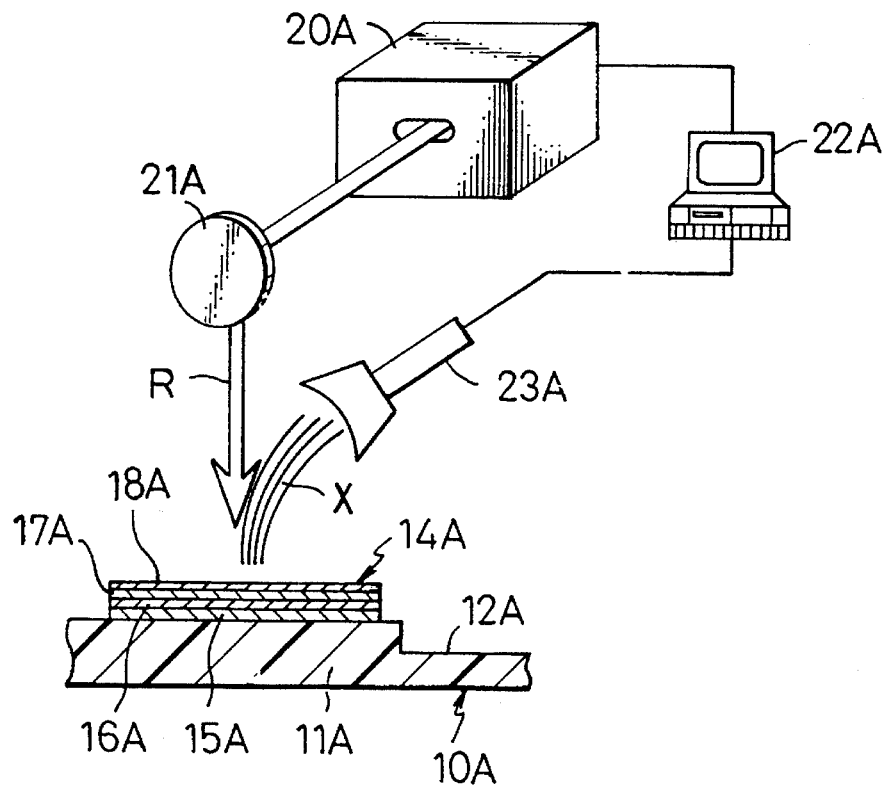
FIG. 4 is an explanatory view for another embodiment of the arrangement used for performing the surface treating of the conductor parts according to the present invention.

In an embodiment shown in FIG. 4, a scattering substance detector 23A is employed in place of the CCD camera, which detector 23A takes up such substance X as gas or metal vapor scattered from the surface of the conductor part 14A into the atmosphere at irradiating zone of the laser beam R and detects components of the substance. This detection information is provided to the control means 22A for analysis thereof so that, when the detection information contains an information implying a potential alloying, the control means 22A controls the laser irradiating means 20A so as to lower the energy density or to reduce the shot number. In this case, a state in which the scattering substance detector 23A detects an evaporation of gold should be used as the limitation of the irradiation of the laser beam R.

Figure 5:
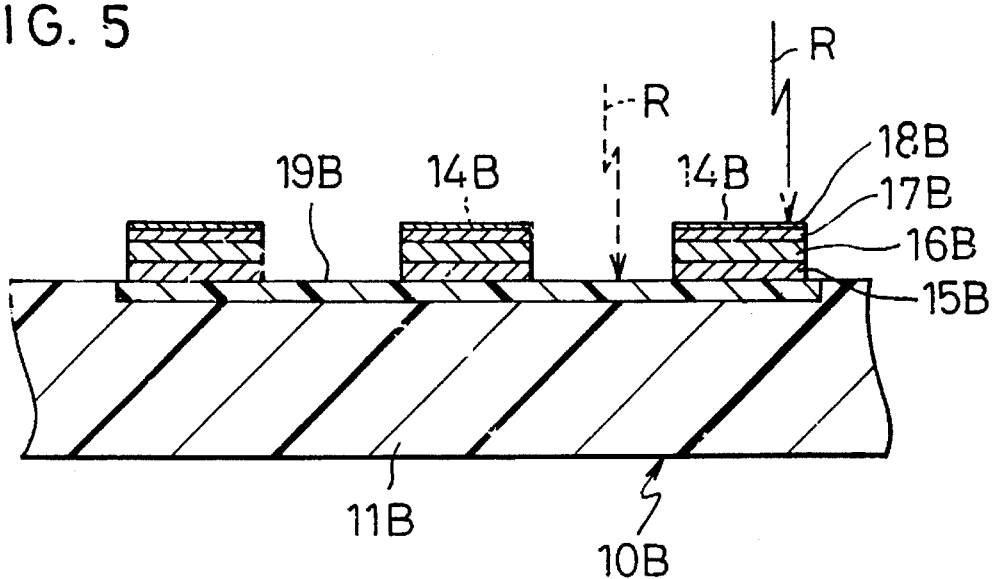
FIG. 5 is a fragmentary sectioned view as magnified of the printed circuit substrate in another embodiment of the present invention.

Referring to FIG. 5, there is shown another printed circuit board 10B according to another embodiment of the present invention, in which the substrate 11B is formed almost entirely of a modified polyimide resin substantially except that a surface portion 19B of the substrate 11B includes portions where the respective conductor parts 14B are provided and spaces between those conductor parts 14B. The surface portion 19B is formed of Teflon™ having a high threshold value, i.e., melting temperature, with respect to the laser beam R, in particular, EXIMER laser. Since the surface portion 19B of the substrate 11B disposed below and between the respective conductor parts 14B is formed of Teflon, the irradiation of the laser beam R at a level below the threshold value of Teflon causes no resin component to be scattered from the surface of the substrate 11B, whereby, in contrast to the foregoing embodiments requiring the controlled irradiation of the laser beam with respect to the substrate made of the modified polyimide resin, the present embodiment allows an irradiation of a considerably strong laser beam R to be carried out without involving any scatter of the resin component, and it is possible to expand a selection range of the laser beam R. Consequently, the provision of the surface portion 19B made of a material having a high threshold value with respect to the energy beam is effectively contributive to the improvement in the surface treating effect of the conductor parts 14B.

Figure 6:
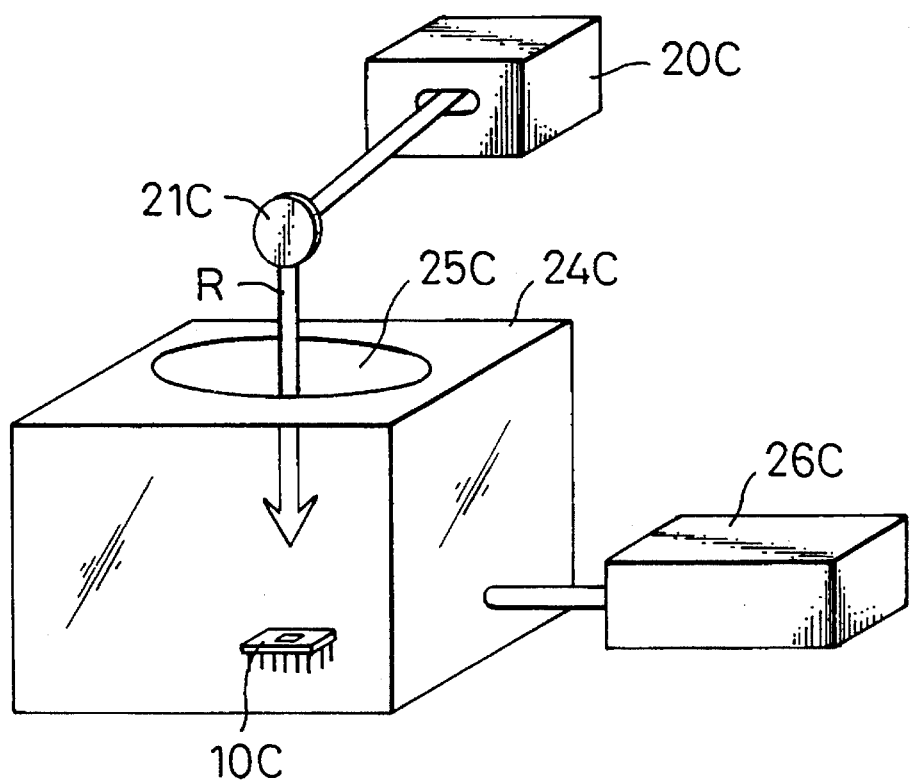
FIGS. 6 and 7 are explanatory views for further and different embodiments of the arrangement for performing the treating according to the present invention.

Referring now to FIG. 6, there is shown another embodiment of the present invention, in which a vacuum treating chamber 24C of a hermetic structure is provided. In an upper side wall of this vacuum treating chamber 24C, there is a circular window 25C sealed by a synthetic quartz permeable to the laser beam R, and a vacuum pump 26C is provided on one side of the chamber to communicate with the interior thereof. In this case, the printed circuit board 10C is housed inside the vacuum treating chamber 24C, the interior of the chamber 24C is evacuated by the pump 26C, and the laser beam R is irradiated through the synthetic quartz of the window 25C onto the conductor parts of the board 10C. Vacuum level should preferably be about $10^{-1}$ to $10^{-3}$ Torr, and any scattered substance of the resin component will not adhere to the conductor parts of the printed circuit board 10C.

Figure 7:
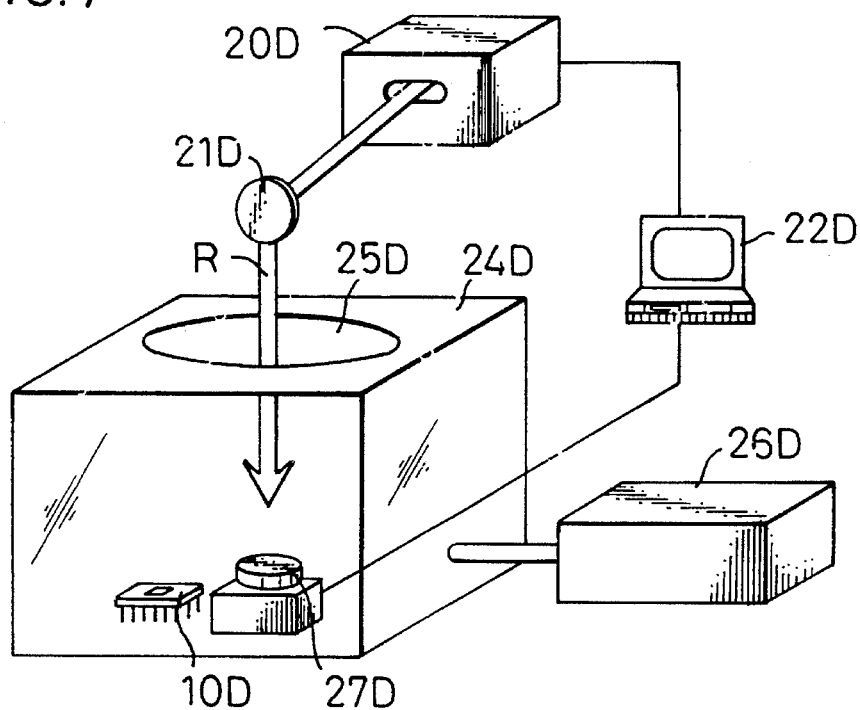

In another embodiment shown in FIG. 7, an energy-amount detector 27D is disposed, concurrently with the printed circuit board 10D, within the vacuum treating chamber 24D having the circular window 25D closed by the synthetic quartz and coupled to the vacuum pump 26D. Detection information of this detector 27D on the amount of energy irradiated is provided as an input to the control means 22D, while the control means 22D is provided with a mirror 21D for causing the same laser beam R irradiated to the printed circuit board 10D to alternately be irradiated to the energy-amount detector 27D whereby the amount of energy can be detected precisely so that, as required, the amount of energy of the laser beam R irradiated from the laser irradiating means 20D can be properly increased and decreased by the control means 22D.

Further, so long as the amount of energy of irradiated laser beam R is the same, it is recognizable that a contamination of the synthetic quartz at the window 25D is in advanced state as the amount of energy detected at the energy-amount detector 27D decreases. As the contamination at the window 25D exceeds a fixed limit, the control means 22D is to provide instructions for exchanging or cleaning the synthetic quartz of the window 25D. Further, the irradiation of the laser beam R onto the energy-amount detector 27D is to be carried out periodically at fixed time intervals. When the relationship between the number of the printed circuit board 10D treated with the laser beam irradiated and the advancement of contamination at the window 25D is preliminarily obtained, it is made possible to anticipate the time of exchange of the synthetic quartz of the window 25D or to determine adjusting extent of the radiating conditions of the laser beam R in accordance with contaminated state of the window 25D, only by measuring the contaminated state by means of the irradiation of the laser beam R onto the detector 27D after a certain time elapsed.

Figure 8:
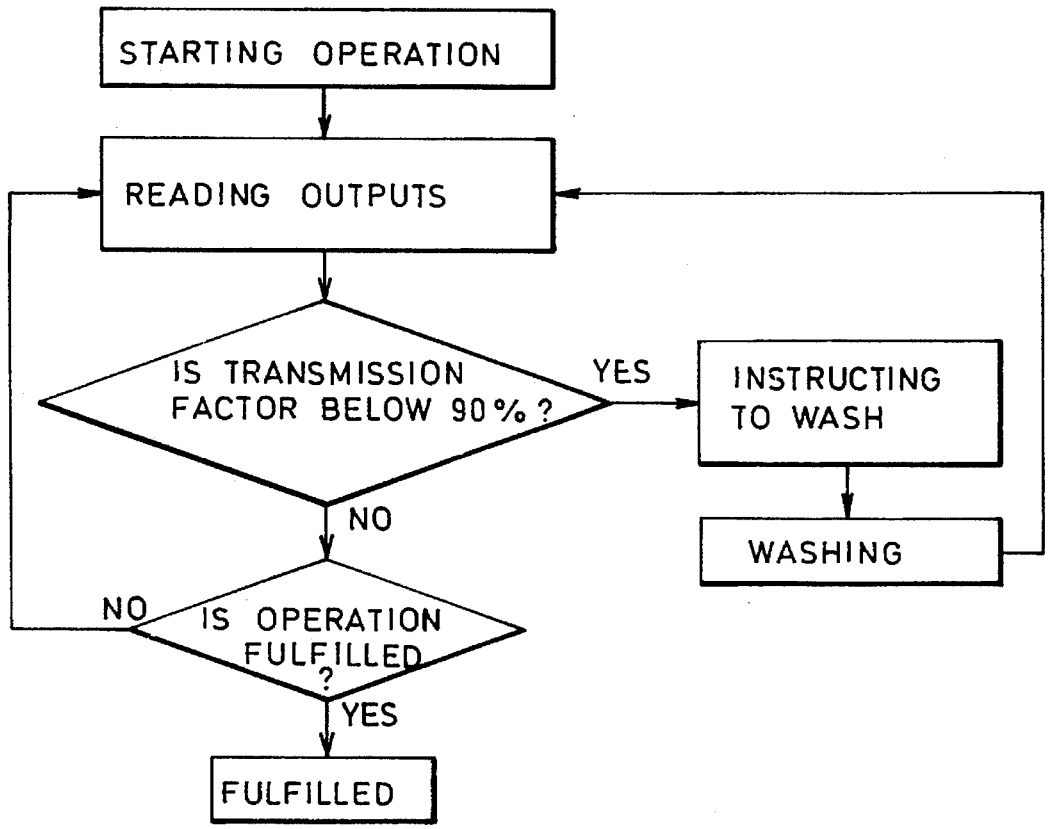
FIG. 8 is a flow chart of the operation performed in the embodiment of FIG. 7.

In FIG. 8, there is shown a flow chart of a working aspect of the control operation of the control means 22D. As the operation is started at the control means 22D, an output of the detector 27D is read, and then the transmission of the window 25D is discriminated. Provided here that a state where the transmission has become less than, for example, 90% is regarded to be a discrimination reference, then the cleaning of the window 25D is instructed, and, upon completion of the cleaning, the output reading with respect to the detector 27D is restored. When the transmission is exceeding 90%, it is determined whether or not the discriminating operation is terminated, and the termination of the discriminating operation or the restoration of the output reading with respect to the detector 27D is performed.

Figure 9:
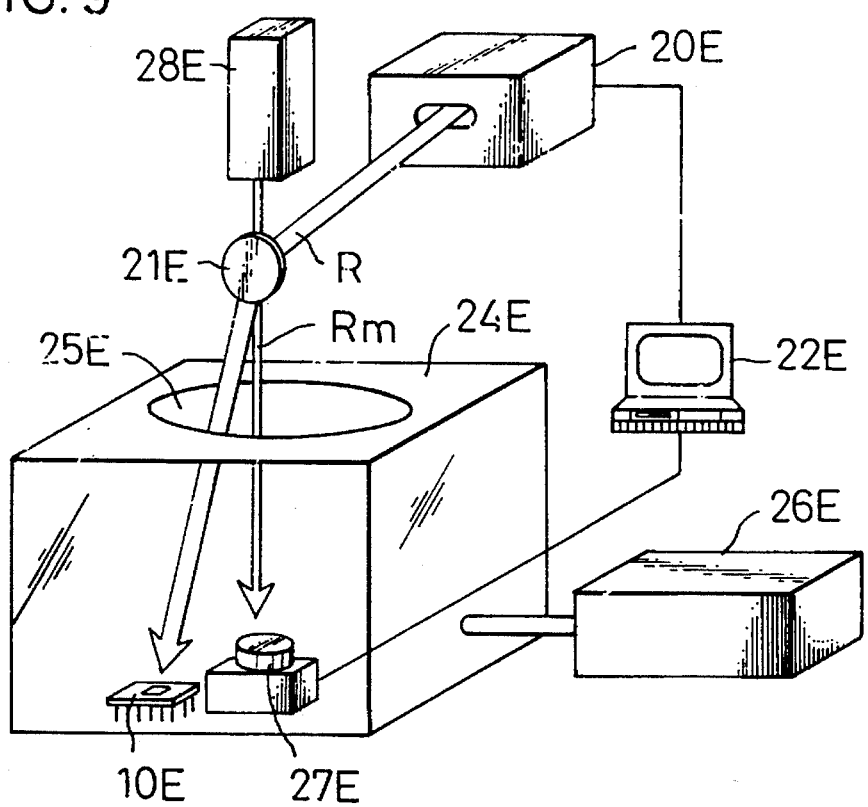
FIGS. 9 through 13 are explanatory views for still further and different embodiments of the arrangement according to the present invention.

In another embodiment shown in FIG. 9 according to the present invention, in addition to the laser beam R for the surface treating of the printed circuit board 10E is provided to the detector 27E. In this case, the YAG laser or semiconductor laser is employed as the transmission measuring laser beam Rm, which is irradiated from another laser irradiating means 28E, and it is made unnecessary to irradiate the surface treating laser beam R alternately to the detector 27E and the printed circuit board 10E as in FIG. 7. The control operation at the control means 22E in the present instance can be realized in the same manner as in the embodiment of FIG. 7 and along the flow chart of FIG. 8.

Figure 10:
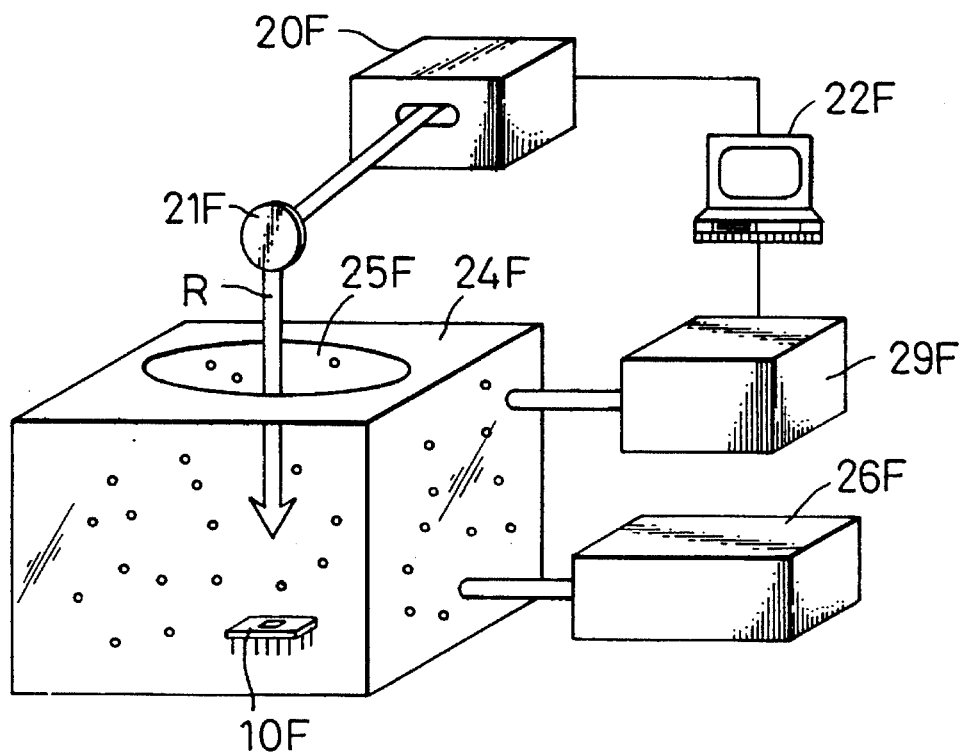

Referring to FIG. 10, there is shown another embodiment of the present invention, the vacuum treating chamber 24F in the hermetical structure is provided with an element analyzing means 29F, comprising a quadripole mass spectrograph performing an ionization of the gas mixed in the atmosphere of the vacuum treating chamber 24F and an analysis of gas-forming elements by presuming the mass number with a voltage and high frequency. For the elements to be detected by the element analyzing means 29F, it is effective to analyze carbon which can precisely represent the mixing ratio of the scattered substance. For the amount of detection of the objective element, it is optimum to obtain the same through a relative comparison with a detected amount of other elements.

In carrying out the surface treatment with the laser beam R irradiated onto the printed circuit board 10F, the occurrence of the scattered substance from the resinous part of the board 10F causes the atmosphere in the vacuum treating chamber 24F to be thereby contaminated. At this time, carbon among the scattered substance is detected by the element analyzing means 29'F. Any variation occurring in the peak value of the detected element is unput to the control means 22F, and instructions for cleaning the interior of the vacuum treating chamber 24F are provided from the control means 22E. For the cleaning of the interior of the vacuum treating chamber 24F, an ultrasonic cleaning with alcohol is employed.

Figure 11:
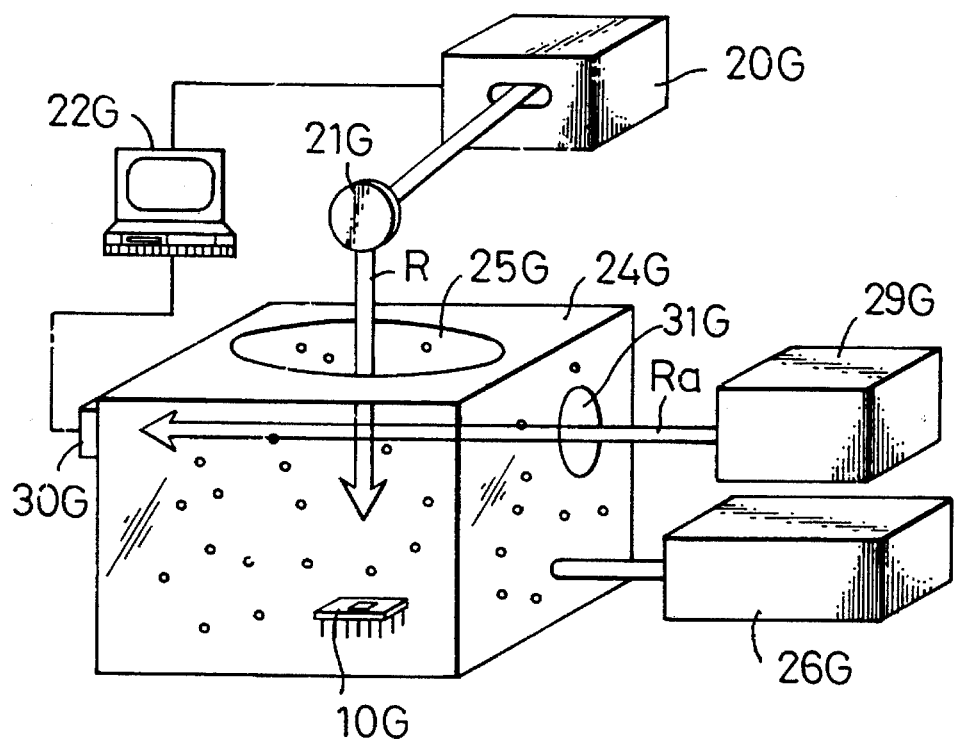

In another embodiment of the present invention as shown in FIG. 11, the vacuum treating chamber 24G is provided with an other laser beam irradiating means 29G in addition to the irradiating means 20G for the surface treating laser beam R, and is also provided with a detector 30G for detecting a measuring laser beam Ra irradiated from the means 29G. In this case, the laser beam Ra irradiated from the means 29G is made incident through a further side-wall window 31G permeable only to the laser beam and through the interior of the chamber onto the laser beam detector 30G disposed opposite the window 31G of the chamber 24G, so that the permeation of the laser beam Ra is measured by the detector 30G. Here, the amount of energy detected by the detector 30G is decreased more and more as the mixture amount of impurities increases. As the measuring laser beam Ra, the YAG or semiconductor laser may be employed. Here, the output of this laser beam Ra is made constant, and the instructions for the cleaning of the interior of the vacuum treating chamber 24G are made to be provided out of the control means 22G receiving the output of the detector 30G, at the time when the output level of the detector 30G is decreased to be, for example, below 90% of the oscillation output.

Figure 12:
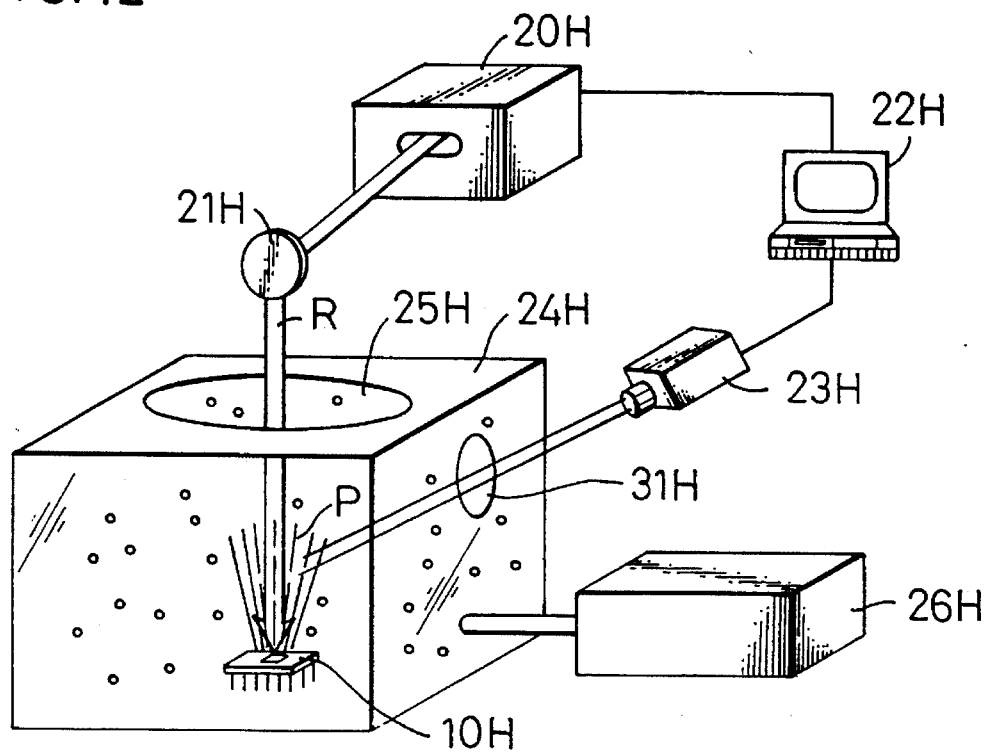

In another embodiment shown in FIG. 12 of the present invention, the vacuum treating chamber 24H is provided with a further side-wall window 31H permeable only to the laser beam, and a CCD camera 23H is disposed for observing, through this permeable window 31H, the surface part of the printed circuit board 10H. In this instance, as the surface treating laser beam R is irradiated through the top side window 25H of the chamber 24H onto the conductor parts on the board 10H for their surface treating, there arises a luminescence with a plasma P taking place in a space adjacent to the board 10H. Since this plasma P increases the amount of luminescence as the impurity mixture in the interior atmosphere of the chamber 24H increases, any varying state of the plasma P is monitored by the CCD camera 23H. The thus monitored image of the CCD camera 23H is provided as an input electronic information into the control means 22H, where the image information is analyzed. The mixture state of the impurities in the atmosphere of the vacuum treating chamber 24H is recognized from the result of the analysis so that, when the luminescence of the plasma P has become, for example, less than 90% of its peak value, there will be provided instructions for cleaning the interior of the vacuum treating chamber 24H by the control means 22H.

Figure 13:
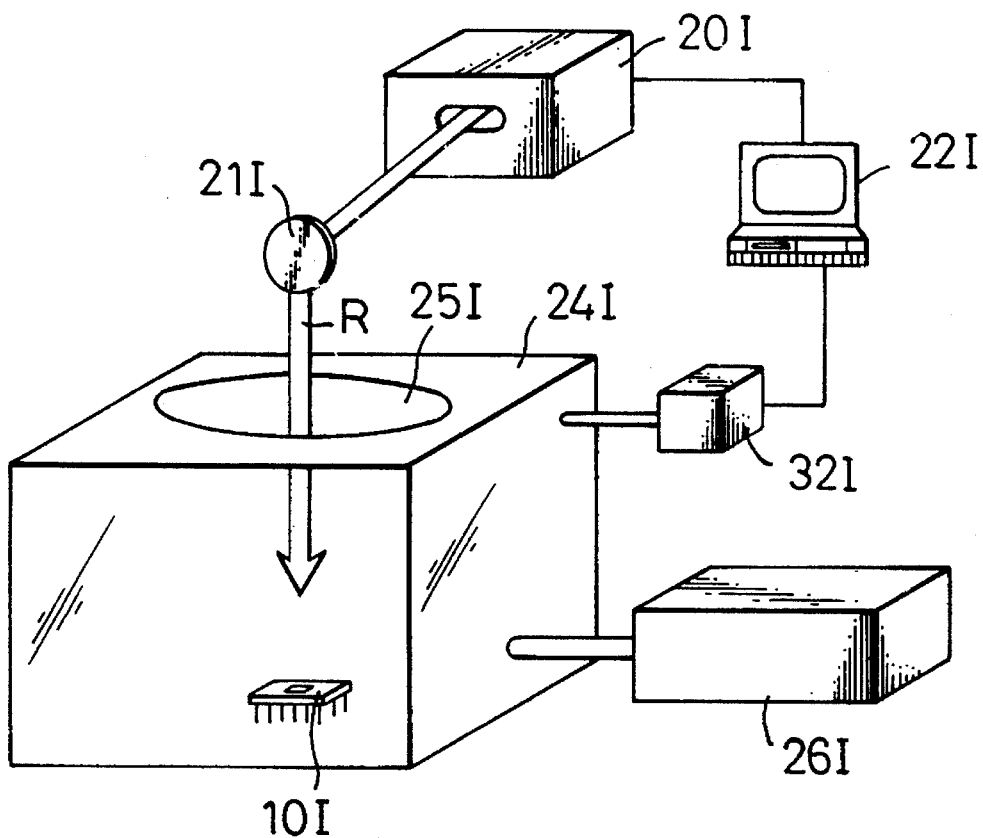

In another embodiment shown in FIG. 13 of the present invention, the vacuum treating chamber 24I is provided with a pressure detector 32I, a detection information of which is provided to the control means 22I. As the mixing ratio of the impurities in the interior atmosphere of the vacuum treating chamber 24I increases, the interior pressure rises and, when this pressure exceeds a preliminarily set limitation, the control means 22I provides instructions for cleaning the interior of the vacuum treating chamber 24I. Thus, the interior pressure of the vacuum treating chamber 24I is set, for example, at $1\times10^{-2}$ to $5\times10^{-2}$ Torr, and the arrangement is so made that the instructions for the cleaning are provided when the interior pressure of the vacuum treating chamber 24I exceeds this preliminarily set range.

Figure 14:
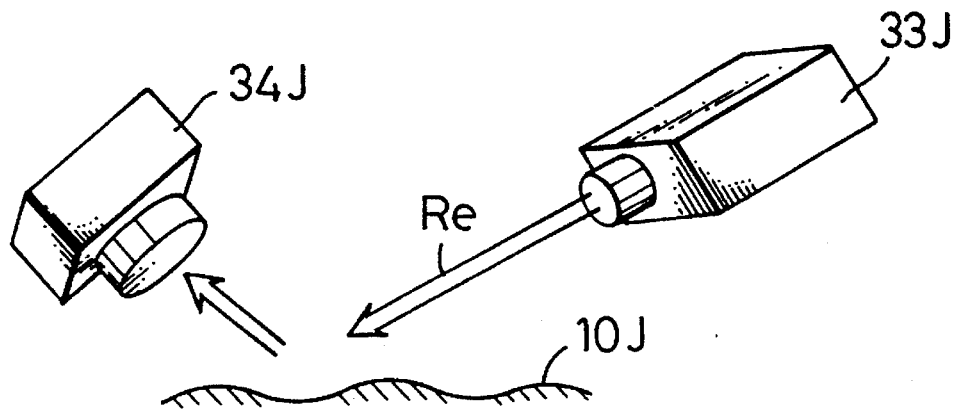
FIG. 14 is an explanatory view for an evaluating method with respect to the surface treatment of the conductor parts according to the present invention.

In recognizing the result of the surface treating performed with respect to the conductor parts on the printed circuit board, there may be employed such arrangement that, as shown in FIG. 14, a laser beam Re for measuring purpose is irradiated from the other laser irradiating means 33J onto the treated conductor surface of the printed circuit board 10J, and the laser beam Re reflected from the treated conductor surface of the board 10J is detected by the laser beam detector 34J. At this time, the measuring laser beam Re is set to be of a minute amount of energy which causes no variation to occur on the conductor surface of the printed circuit board 10J. Further, it is optimum to employ a visible light for the measuring laser beam Re so as to give no affection on the conductor surface of the board 10J. Now, as the measuring laser beam Re is irradiated from the laser irradiating means 33J onto the printed circuit board 10J, the amount of reflection of the laser beam Re, that is, the amount of energy detected at the detector 34J is varied in response to the state of unduration at the conductor surface of the printed circuit board 10J. So long as the surface treating performed with respect to the printed circuit board 10J has been appropriate, the conductor surface should be smooth, while the printed circuit board which has not be treated as yet or has been insufficiently treated should involve a minute unduration. Thus, in respect of the printed circuit board 10J having, in particular, a smooth and excellent conductor surface, the amount of reflection of the measuring laser beam Re and eventually the amount of energy detected will be large.

Provided here that an output value of the detector 34J with respect to the conductor surface of the printed circuit board 10J to which the optimum surface treating has been carried out or an output value of the detector 34J with respect to the conductor surface the surface treating to which has not been performed as yet or has been carried out but insufficient is preliminarily obtained, it is possible to recognize the quality of the surface treating only by irradiating the measuring laser beam Re onto the conductor surface of the printed circuit board 10J with respect to which the surface treating has been carried out. In an event where the detected amount of energy at the detector 34J in respect of the irradiated energy output of the measuring laser beam Re is less than 50%, for example, it is discriminated that the surface treating is inferior. Further, the variation in the amount of reflection of the irradiated laser beam due to the extent of the unduration of the conductor surface of the printed circuit board 10J is influenced by the disposition of the measuring laser beam irradiating means 33J and reflection detector 34J or, in other words, the incident and reflection angles of the laser beam Re with respect to the conductor surface of the printed circuit board 10J. It is thus effective to set the incident and reflection angles of the measuring laser beam Re so that there will be a clear and definite difference in the amount of reflection between the printed circuit board 10J of the excellent surface treating and the further printed circuit board of the inferior surface treating.

Figure 15:
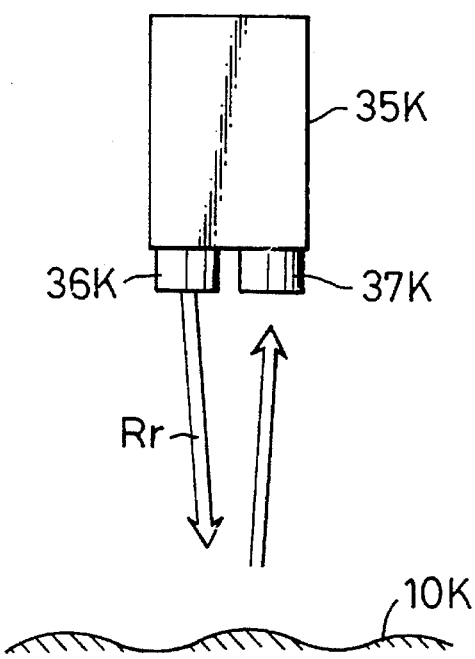
FIGS. 15 through 17 are explanatory views for other aspects of the evaluating method of the surface treatment according ot the present invention.

According to the present invention, as shown in FIG. 15, surface roughness is measured by means of a laser roughness meter 35K with respect to the printed circuit board 10K to the conductor surface of which the surface treating has been carried out. This laser roughness meter 35K is arranged to irradiate a measuring laser beam Rr from its irradiating part 36K to the surface of the printed circuit board 10K, and to catch the reflection light from the surface of the board 10K at a detecting part 37K, so that the surface roughness can be measured. In this case, a discrimination of the surface roughness will be so made that a smaller surface roughness represents a more sufficient surface treating, while the surface roughness involving a fluctuation at most more than 1 to 2 µm, for example, is regarded inferior.

Figure 16:
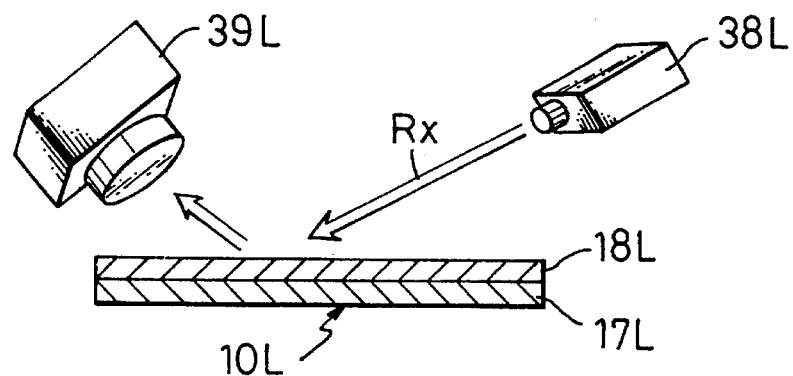
Figure 17:
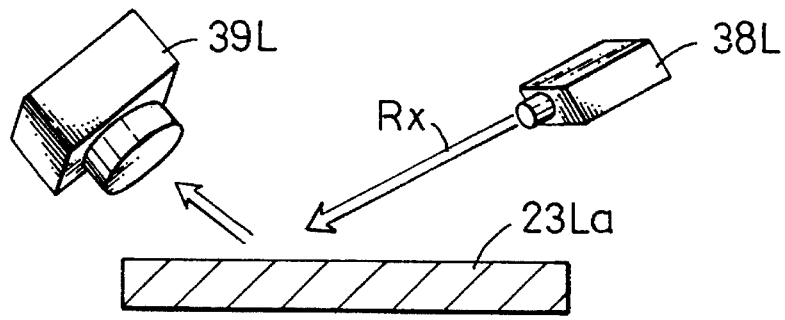

According to the present invention, further, it is possible to discriminate the quality of the surface treating through other various steps. As shown in FIGS. 16 and 17, for example, an X-ray beam may be effectively employed in place of the laser beam. In this case, an X-ray beam Rx is irradiated from an X-ray ocsillator 38L onto the conductor part of the printed circuit board 10L, and a reflected X-ray is detected at an X-ray detector 39L. An input information to this X-ray detector 39L as reflected back from the conductor surface of the printed circuit board 10L can represent a highly precise discrimination of the difference in metallic organization of the conductor parts on the printed circuit board 10L. In other words, an output information of the X-ray detector 39L in respect of an event where the fused layer 18L is formed on the top of the surface gold layer 17L of the conductor part on the printed circuit board 10L as in FIG. 16 is effectively different from that in respect of an event where an alloy layer 23La is formed as in FIG. 17. It should be appreciated that, when the output information of the X-ray detector 39L denotes the presence of the alloy layer, the surface treating is discriminated to be inferior.

All other arrangements as to the printed circuit board than those of the foregoing printed circuit boards described with reference to FIGS. 4 through 17 respectively are the same as those described in the foregoing with reference to FIGS. 1 and 2 or FIG. 3, the same constituents in the foregoing twelve embodiments in FIG. 4 and followings as those in FIGS. 1 and 2 or FIG. 3 are denoted by the same reference numerals with addition of sequentially each of alphabets A to L added, and these embodiments can attain the same functions and effect as those in the foregoing embodiments of FIGS. 1 and 2 and FIG. 3 as well as preceeding embodiments.

According to another feature of the present invention, the energy beam is irradiated as condensed onto the conductor parts of the printed circuit board, as a measure for further improving the effect of the surface treating.

Figure 18:
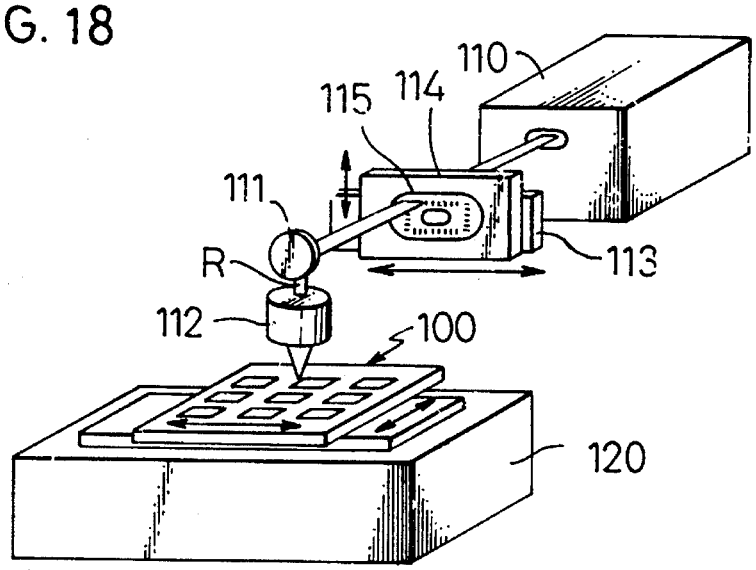

Referring to FIG. 18, there is shown another embodiment of the present invention for realizing the above feature, in which the printed circuit board itself is the same as that in the foregoing embodiment of FIGS. 1 and 2. In the present embodiment, normally, a plurality of the printed circuit boards 100 are arranged on an X-Y table device 120. The laser beam R is irradiated from such laser irradiating means 110 as the EXIMER laser onto the respective printed circuit boards 100 through a shield plate 114 supported for shifting in X and Y directions, that is, in vertical and horizontal directions by a drive and support means 113, a mirror 111 and an optical focusing system 112. When in this case the density of energy irradiated of the laser beam R is set to be in a range of about 0.1 to 0.5 $J/cm^2$, for example, it is made possible to perform the removal of contaminated substance from the surface of the conductor parts as the main action of the surface treating but, when the density of energy irradiated of the laser beam R is set in a range of about 0.5 to 3.0 $J/cm^2$, for example, it becomes possible to have the surface of the conductor parts fused as the main surface treating action, so that the smoothing of the surface and the activation of the metal can be effectively attained.

In the shield plate 114, a transmitting part 115 is formed in a pattern into which irradiating pattern of the laser beam R to be irradiated onto the printed circuit boards 100 is enlarged three times as large as the original. Further, the irradiating pattern of the laser beam R passed through the transmitting part 115 is reduced to be ⅓ at the focusing system 112 and is then irradiated onto the surface of this printed circuit board 100. Each irradiation range of the laser beam R is about 5×5 mm, for example, while an irradiation over a wider range than this should cause a deviation between the pattern of the transmission part 115 and the irradiating pattern becomes excessive. Accordingly, for the purpose of irradiating the laser beam R to the whole of the conductor parts on each printed circuit board 100, it is required to move the laser beam R, printed circuit board 100 and shield plate 114 relative to each other.

Referring to a concrete operation of the present embodiment, further, the laser beam R is oscillated continuously from the laser beam irradiating means 110 and the shield plate 114 and printed circuit boards 100 are moved. In this case, the continuous oscillation operation should include such one as a pulse laser which is oscillated intermittently continuously. While optimumly moving the shield plate 114 and printed circuit board 100, the laser beam, R is irradiated to the whole of the formed pattern of the conductor parts on the printed circuit board 100. The foregoing pattern of the shield plate 114 is formed to be three times as large as the irradiating pattern onto the printed circuit pattern 100. Therefore, the printed circuit board 100 and shield plate 114 and moved in synchronism with each other, and their moving rate and amount are controlled so as to be three times as large as the movement of the printed circuit board 100. When the magnifying power of the pattern of the transmission part 115 is varied, the moving rate and amount of the shield plate 114 and printed circuit board 100 are also modified in their ratio. With such method employed, the treating work can be efficiently performed without interrupting the irradiation of the laser beam R.

As another method, it is possible to carry out the shifting of the shield plate 114 and of the printed circuit boards 100 separately, to irradiate the laser beam R after completion of their shift to predetermined positions, and to repeat such shift and irradiation alternately. Since in this method the shifts of the shield plate 114 and of the printed circuit boards 100 are not required to be synchronized with each other, their shift control is simplified though required working time is prolonged.

Figure 19:
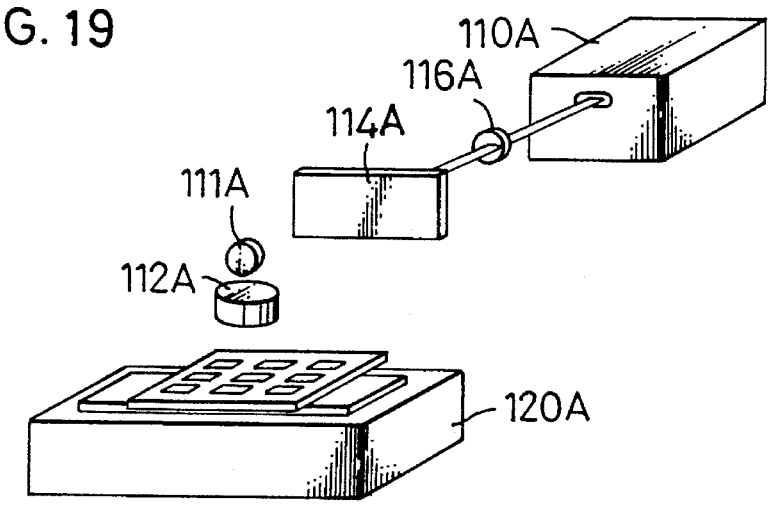
Figure 20:
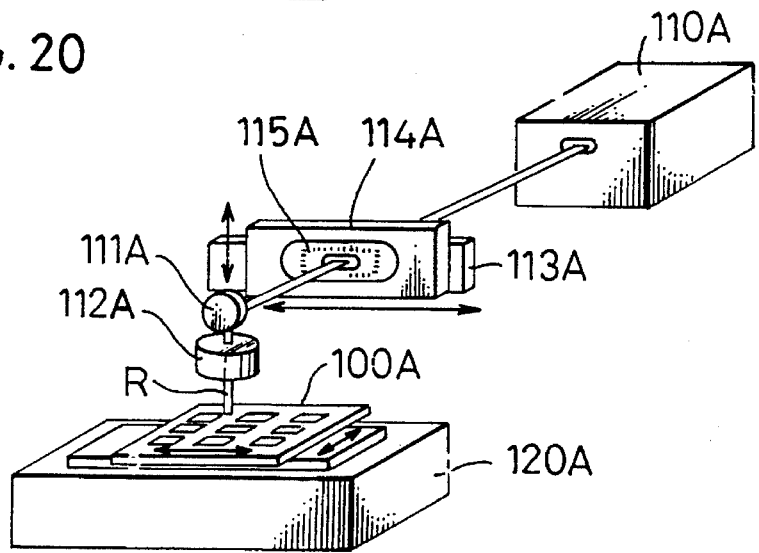

In another embodiment shown in FIGS. 19 and 20, a precursory shield plate 114A' before being provided with the transmission part 115A is disposed at mounting position of the shield plate 114A, and an additional optical focusing system 116A is provided between the laser irradiating means 110A and the precursory shield plate 114A'. Then the laser beam R is irradiated to the focusing system 116A, the beam is condensed at the position of the precursory shield plate 114A', and any desired portion in the precursory shield plate 114A' where the condensed laser beam R is thus irradiated can be perforated. Accordingly, the precursory shield plate 114A' is subjected to a perforating work in accordance with the predetermined pattern, by shifting the precursory shield plate 114A+ through the drive and hold means 113A according to the predetermined pattern or shifting the laser beam R to scan the plate 114A' according to the predetermined pattern, and the transmission part 115A is thus provided to the plate 114A' to render the same to be the complete shield plate 114A. At this time, such irradiating conditions as the density of energy or the like of the laser beam R are so set as to have the perforation for the shield plate 114A carried out in smooth manner.

Thereafter, the additional optical focusing system 116A for the laser working use is removed while keeping the shield plate 114A having the trasmission part 115A at the same position, and the laser beam R is irradiated through the transmission part 115A of the shield plate 114A onto the conductor parts on the respective printed circuit boards 100A in the same manner as in FIG. 18. In the present embodiment, the transmission part 115A having the highly precise pattern is formed in the shield plate 114A through the laser work, and the position where the transmission part 115A is formed in the shield plate 114A is the same as the position where the transmission part 115 is used for the surface treating of the printed circuit boards 100A, so that the surface treating of conductor parts on the printed circuit boards in respect of a predetermined area can be performed without causing no error to occur in the irradiating pattern due to any positional deviation of the shield plate 114A or eventually of the transmission part 115A.

Figure 21A:
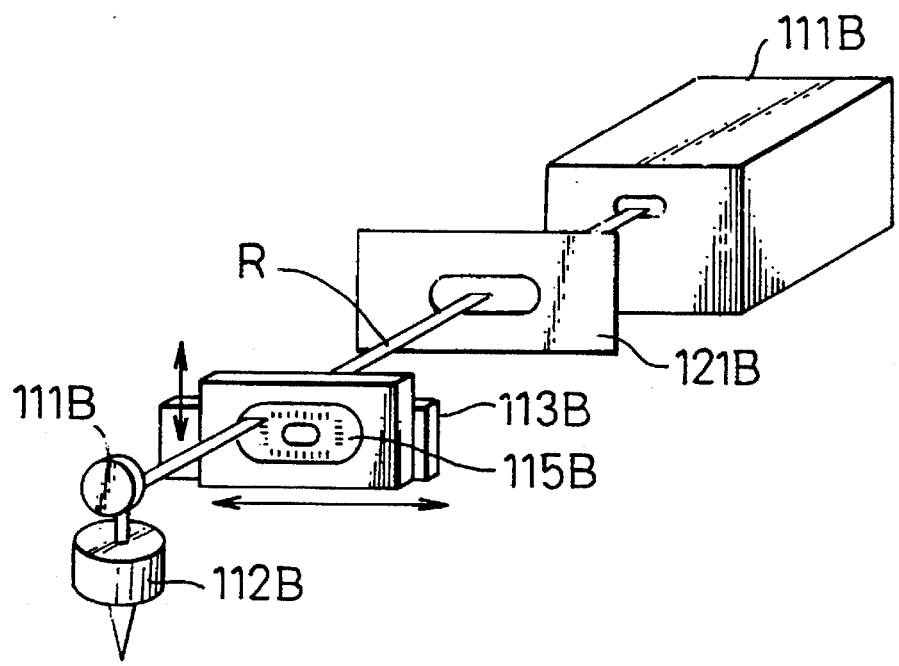
Figure 21B:
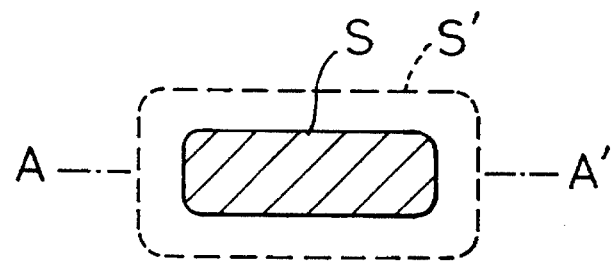
FIG. 21B is an explanatory view for an energy beam formed in the embodiment shown in FIG. 19.
Figure 21C:
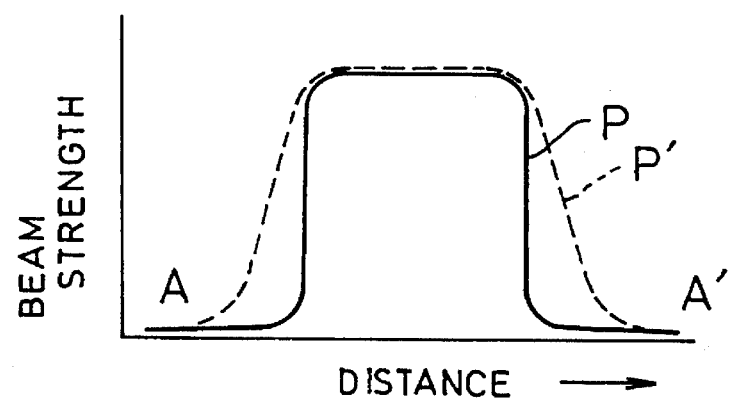
FIG. 21C is a diagram showing the intensity distribution of the energy beam in the embodiment of FIG. 19.

In FIG. 21, there is shown another embodiment according to the present invention, in which the laser beam R is first subjected to a shaping of sectional shape of the beam and is then used for the surface treating of the conductor parts on the printed circuit board. More specifically, the sectional shape of the laser beam R just irradiated from the laser irradiating means 111B without the shaping is such expanded rectangular shape as denoted in FIG. 21B by a dotted line S', while the beam intensity distribution along a center line A–A' in longitudinal direction of this unshaped rectangular beam S' is as shown by a dotted line curve P' in FIG. 21C, according to which the beam intensity is shown to be substantially constant at positions closer to the center of the beam but to be of a tendency of gradually decreasing at peripheral parts.

When such laser beam R as in the above is irradiated onto the conductor parts on the printed circuit boards, the objective surface treating effect may be obtained at portions of the conductor parts irradiated by the beam portions of the constant intensity, but there is a risk that a sufficient surface treating effect cannot be realized at portions irradiated only by the peripheral parts of the beam where the intensity gradually decreases. Accordingly, in the present embodiment, such beam shaping means 121B as a beam filter or the like is disposed between the laser irradiating 111B and the transmission part 115B of the shield plate. When in this state the laser beam R is irradiated as in the foregoing embodiment to carry out the surface treating of the conductor parts, then the laser beam R which is shaped by the beam shaping means 121B is caused to be irradiated onto the conductor parts. The sectional shape and intensity distribution of this shaped laser beam R are as shown respectively by a solid line section S and a solid line curve P in FIGS. 21B and 21C. Here, the intensity distribution P of the shaped laser beam R as shown in FIG. 21C excludes both side sloped parts of the intensity distribution curve P' before the shaping, and substantially equal beam intensity as a whole can be obtained. The arrangement is also made for shaping the laser beam section in a direction intersecting at right angles the direction A–A' so that the equal beam intensity can be obtained over the entire range of the section S of the beam shown in FIG. 21B. With the irradiation of thus shaped laser beam R, it is made possible to carry out the surface treating uniformly over the whole range of the surface of the conductor parts, and any locally insufficient treating or any fluctuation in the treating can be effectively eliminated.

Figure 22:
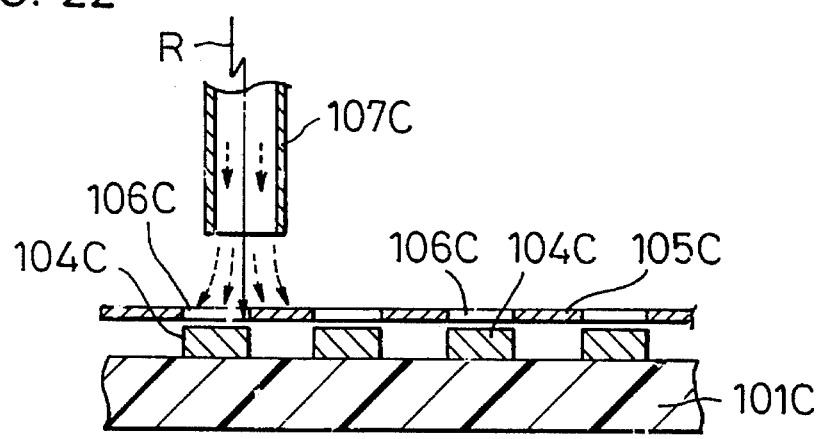
FIGS. 22 and 23 are fragmentary sectioned views as magnified of the printed circuit board in still further embodiments according to the present invention.

In another embodiment shown in FIG. 22 according to the present invention, a shield plate 105C is disposed in proximity to the conductor parts 104C on the substrate 101C. The shield plate 105C is provided with perforations 106C which are formed in a pattern matching that of the conductor parts 104C, and the shield plate 105C is brought into close contact with the conductor parts 104C by joining the perforations 106C to the pattern of the conductor parts 104C, blowing He gas against the shield plate 105C substantially in vertically downward direction through a gas blowing nozzle 107C. Then, the laser beam R is irradiated axially through the gas blowing nozzle 107C onto the conductor parts 104C to which the shield plate 105C is closely contacting. The laser beam R is irradiated to the surface of the conductor parts 104C in accordance with the pattern of the perforations 106C, and the predetermined surface treating is carried out. Since in this embodiment the shield plate 105C is disposed close to condensed position of the laser beam R for the surface treating, a material high in the reflection factor with respect to the irradiated laser beam R is employed for the shield plate. In practice, it is preferable that, when the EXIMER laser is employed, for example, the shield plate 105C made of aluminum materials high in the reflection factor with respect to the said laser.

Since in the present embodiment the conductor parts 104C and shield plate 105C, as well as the perforations 106C eventually are in close contact with each other, the laser beam R is irradiated onto the surface of the conductor parts 104C in a range precisely in conformity with the pattern of the perforations 106C. Any influence of positional deviation or optical distortion also can be minimized. Further, since the He gas flow which urging the shield plate 105C against the conductor parts 104C is effective to fluidize the scattering contamination substance from the surface of the conductor parts 104C so as to be away from the surface, the contamination substance can be prevented from adhering again to the surface of the conductor parts 104C during the treating.

Figure 23:
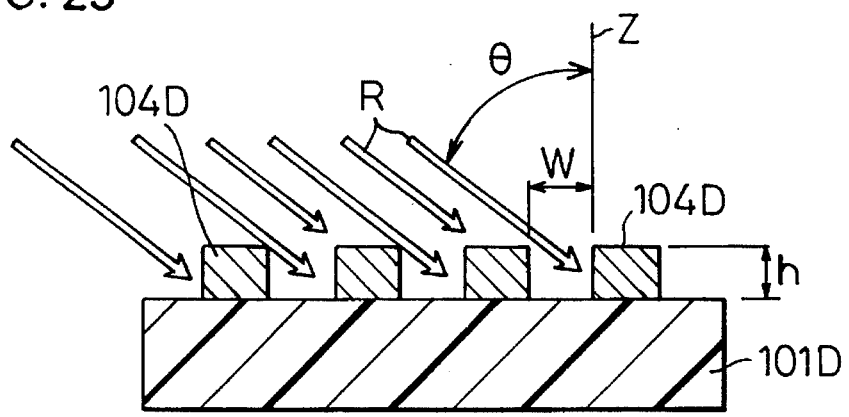

In another embodiment shown in FIG. 23 according to the present invention, the arrangement is so made that the energy beam R is irradiated at a certain angle with respect to the vertical direction to the surface of the conductor parts 104E. More specifically, a plurality of the conductor parts 104D are provided at regular intervals on the substrate 101D, and the laser beam R is irradiated to the surface of the respective conductor parts 104D at an angle θ of inclination with respect to the vertical direction Z to the plane of the substrate 101D. The laser beam R hits the upper surface and irradiating side wall of the respective conductor parts 104D, but the opposite side wall to the irradiating direction and the surface of the substrate 101D continuing to the opposite side wall of the conductor parts 104D are shaded by the conductor parts 104D and not irradiated by the laser beam R. That is, the laser beam R is caused not to irradiate onto the surface of the substrate 101D between the respective conductor parts 104D, and the scattering substance can be effective prevented from occurring. Here, the irradiating angle θ of the laser beam R is set to be $$\theta = \tan^{-1}(W/h)$$

wherein h is the height of the conductor part 104D and W is the intervals between the respective conductor parts 104D.

Generally, in the known PGA type printed circuit board, the conductor parts 104D are respectively 30–40 μm in the height and 100–200 μm in the width, and, in this case, the intervals between the respective conductor parts 104D will be made to be substantially the same as the width of the conductor parts 104D. Substituting these numerical values in the above equation, it is given that the preferable irradiating angle θ of the laser beam B is an angle larger than 68.2° to 81.5° with respect to the vertical line Z, but less than 90°. In this case, the density of energy received per unit area of the surface of the respective conductor parts 104D is reduced as the irradiating angle θ increases, and the laser beam R is to be corrected in its output in accordance with the irradiating angle θ. While there may arise a risk that the laser beam R is caused to reach some surface portion of the substrate 101D depending on disposing aspect of the conductor parts 104D, it will be possible in such event to concurrently employ such scatter preventing means as employed in the foregoing embodiment.

Figure 24:
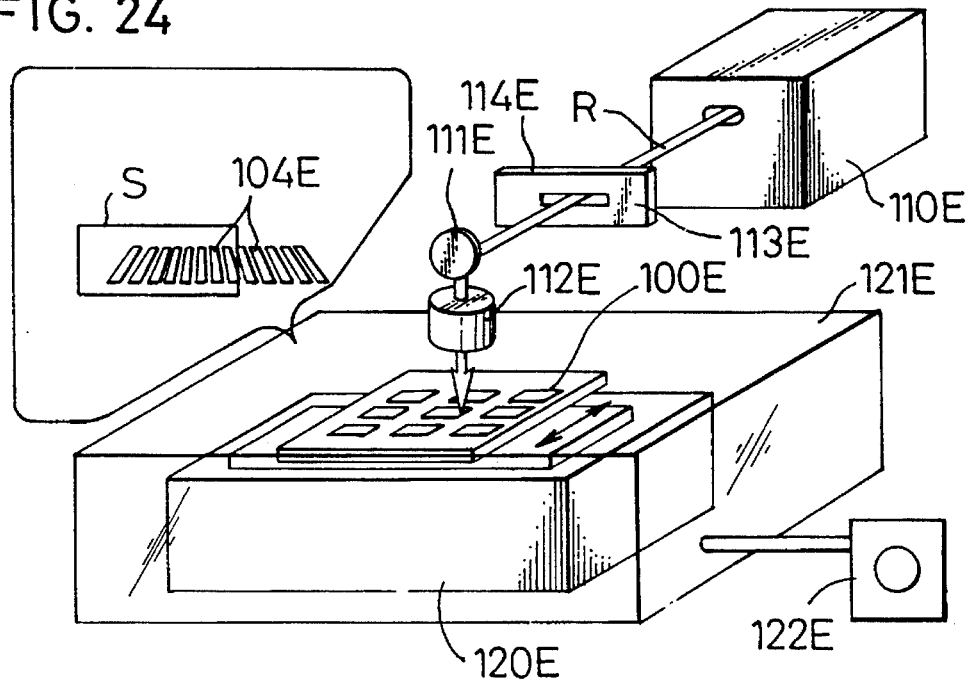
FIG. 24 is an explanatory view for another embodiment of the present invention.
Figure 25A:
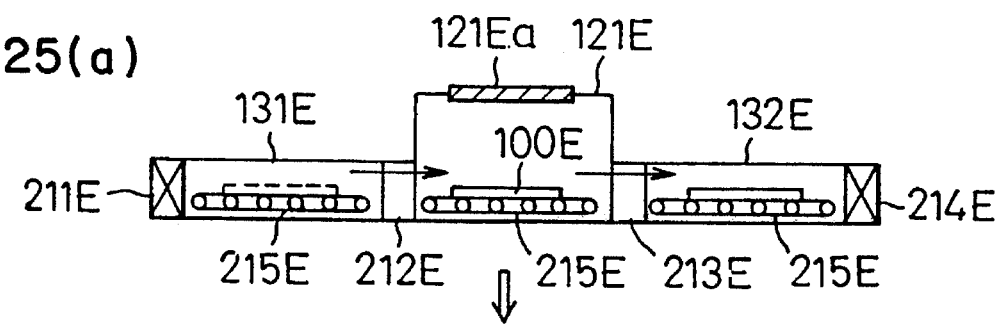
FIG. 25 is an explanatory view for another embodiment including treating steps (a) to (d) according to the present invention.
Figure 25B:
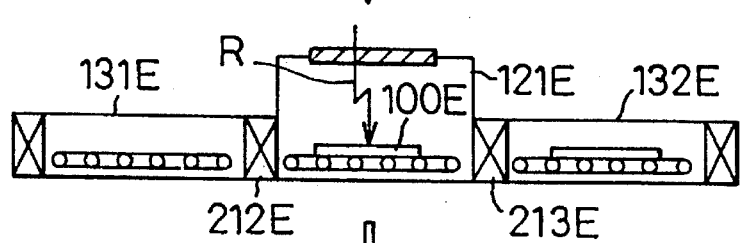
Figure 25C:
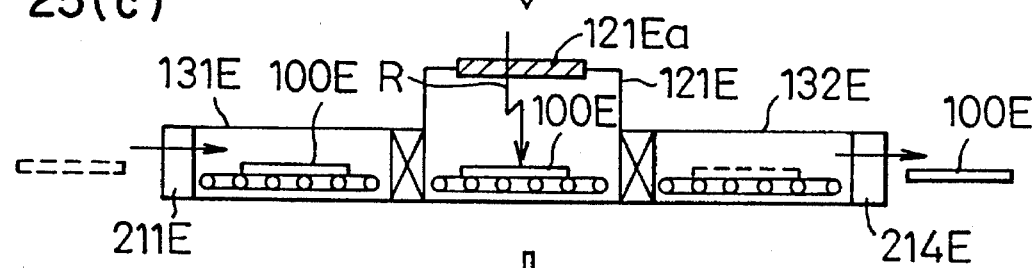
Figure 25D:
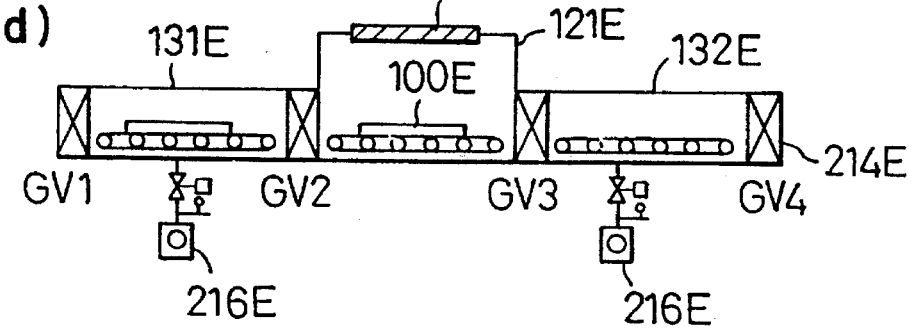

In another embodiment shown in FIG. 24, there is shown an arrangement for irradiating the laser beam R in a vacuum atmosphere. More specifically, the printed circuit board 100E is placed on an X-Y table 120E as accommodated within a vacuum treating chamber 121E. A vacuum pump 122E is connected to this chamber 121E, and the laser beam R irradiated from the laser beam irradiating means 110E disposed outside the vacuum treating chamber 121E is led through the transmission part 113E in the shield plate 114E, mirror 111E, optical focusing system 112E and laser-permeable window (not shown) at optimum portion of the chamber 121E, onto the top surface of the printed circuit board 100E. In the present embodiment, the scattered matter caused upon irradiation of the laser beam R on the substrate 100E has less possibility of being returned to the side of the substrate 100E within the vacuum treating chamber 121E since gas moleculars are reduced to a large extent. That is, the scattered matter is caused to reach a remote position from the substrate 100E enough to be prevented from adhering to the conductor parts 104E, and the scattered matter is rather sucked into the vacuum pump 122E together with atmospheric gas in the chamber 121E.

Figure 26:
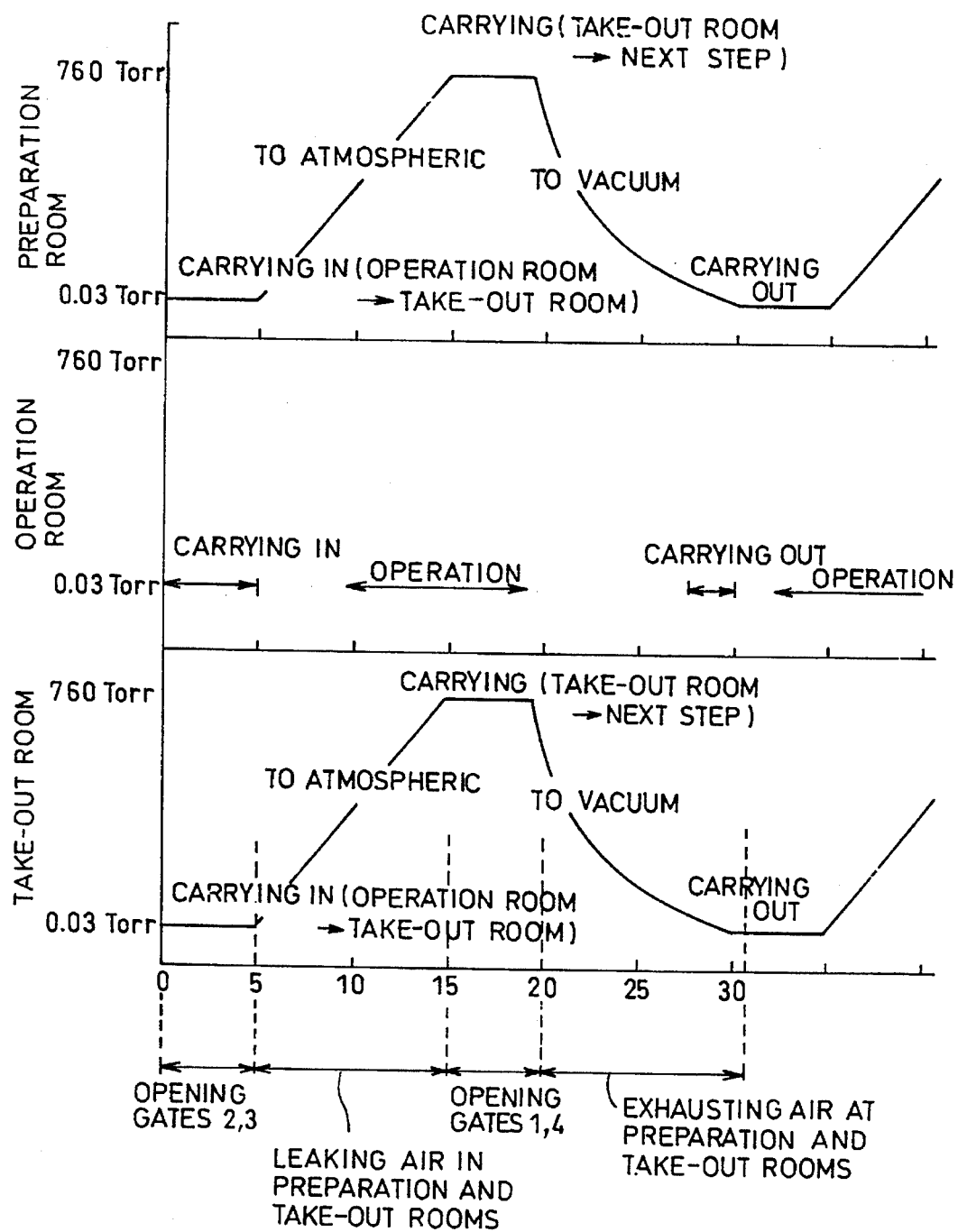
FIG. 26 is an explanatory diagram for the embodiment of FIG. 25.

In FIGS. 25 and 26, there is shown a working aspect employable to the embodiment of FIG. 24, for example, in which a preparation room 131E and a take-out room 132E are provided on both sides of the treating chamber 121E or operating room. In each of these rooms 131E, 121E and 132E, a conveyer 215E for carrying the printed circuit board 100E, and gates 211E–214E are mounted to inlet end of the preparation room 131E, boundaries between the operation room and both side rooms and outlet end of the take-out room 132E. Into the operation room 121E, the laser beam R is irradiated through the laser-permeable window 121Ea on top side of the room, for carrying out the surface treatment of the conductor parts on the printed circuit board 100E. In addition to the operation room 121E, the vacuum pump is also connected to the preparation and take-out rooms 131E and 132E, a pressure sensor (not shown) is provided to the respective rooms 131E, 121E and 132E, and a pressure administration and control is carried out.

In the present embodiment, the surface treatment is executed in the sequence of steps (a) through (d) shown in FIG. 25, while pressure state of the respective preparation, operation and take-out rooms 131E, 121E and 132E at respective treating steps is graphically shown in FIG. 26, in which "760 Torr" denotes the atmospheric state whereas "0.03 Torr" shows the vacuumed state. In particular, as shown in FIG. 25(c), the inlet end gate 211E of the preparation room 131E is opened to enter the printed circuit board 100E into the room, upon which the preparation room 131E is in the atmospheric state, and the gate 212E between this room 131E and the operation room 121E is closed. In the operation room 121E, the previously conveyed printed circuit board 100E is subjected to the irradiation of the laser beam R in the vacuumed atmosphere, and thus the surface treatment is executed. At the take-out room 132E, the outlet side gate 214E is opened in a state where the gate 213E on the side of the operation room 121E, and, as the interior of the take-out room 132E has reached the atmospheric state, the printed circuit board 100E the treatment of which has been previously completed is taken out of the room. Then, as shown in FIG. 25(d), the inlet side gate 211E of the preparation room 131E is closed to vacuum the interior of this room 131E with the vacuum pump, and the take-out room 132E is also vacuumed with the outlet side gate 214E closed and the vacuum pump also driven. Then, as shown in FIG. 25(a), the gate 212E between the preparation and operation rooms 131E and 121E is opened to transfer the printed circuit board 100E from the preparation room 131D to the operation room 121E. At the same time, the gate 213E between the operation and take-out rooms 132E is opened to transfer the printed circuit board 100E the surface treatment of which has been completed in the operation room 121E to the take-out room 132E. Since at this time the take-out room 132E is retained in the vacuum state, the vacuum atmosphere in the operation room 121E is not impaired. Further, as shown in FIG. 25(b), both side gates 212E and 213E of the operation room 121E are closed, the laser beam R is irradiated to the printed circuit board 100E in this room 121E, and the surface treatment is executed. Then, the foregoing step shown in FIG. 25(c) is reached again, a new one of the printed circuit board 100E is conveyed into the preparation room 131E, and the foregoing steps are repeated to execute the surface treatment. In this way, the printed circuit boards 100E can be surface-treated in sequential manner while keeping their high quality.

Figure 27:
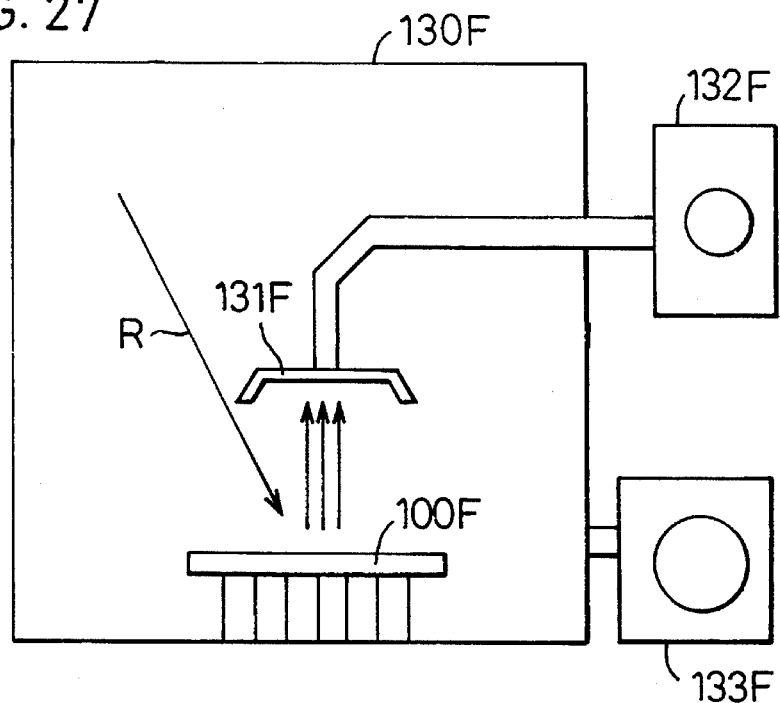
FIGS. 27 through 35 are explanatory views for further and different embodiments according to the present invention.

In another embodiment of the present invention as shown in FIG. 27, a scattered-matter removing means comprises an exhaust suction port 131F disposed as separated upward from the printed circuit board 100F and a high vacuum pump 132F outside the treating chamber 130F and connected to the suction port 131F. In this case, the vacuum pump 133F is provided for maintaining the vacuum state in the whole space of the treating chamber 130F accommodating the printed circuit board 100F. The scattered matter occurring upon irradiation of the laser beam R on the printed circuit board 100F shows a tendency of scattering upward from the board 100F, and such scattered matter is sucked into the suction port 131F to be removed from the vacuumed space. Upon occurrence of the scattered matter due to the irradiation of the laser beam R on the printed circuit board 100F, these occurs a momentary rise in the pressure adjacent to the board 100F, and the suction through the exhaust suction port 131F immediately removes the scattered matter.

It is preferable that the exhaust suction port 131F is provided to be spread over an area opposing a zone in which the scattered matter occurs upon irradiation of the laser beam R on the substrate of the printed circuit board 100F, and the configuration of the suction port 131F may be circular or square. While the distance between the exhaust suction port 131F and the surface of the printed circuit board 100F should vary in accordance with the pressure of the ambient vacuum atmosphere, it is optimum to set the distance to be about 30 mm when the vacuum atmosphere is made, for example, 0.1 Torr.

Figure 28:
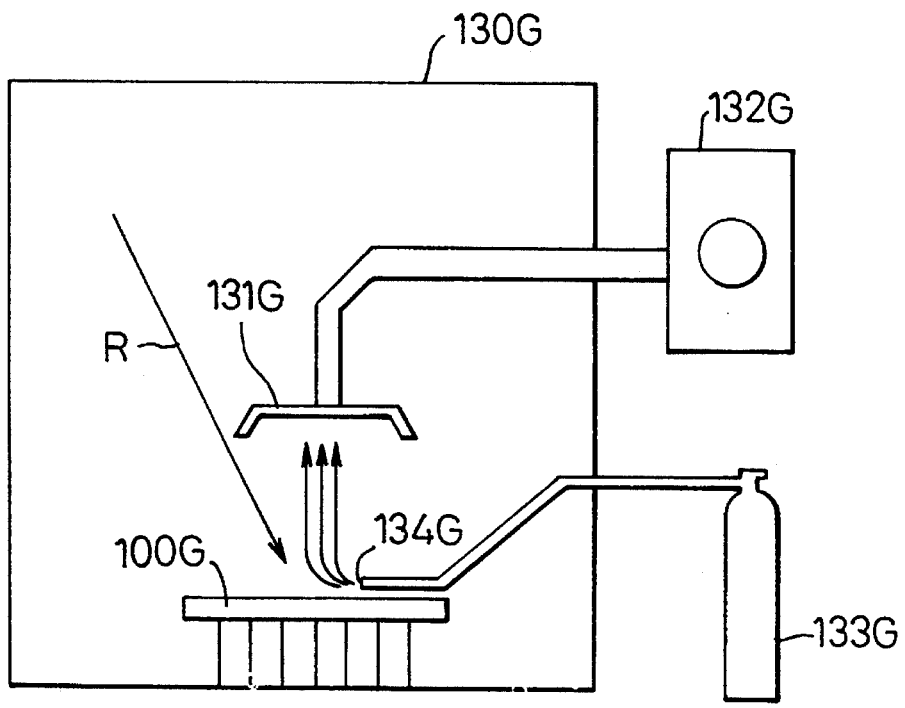

In another embodiment shown in FIG. 28, the scattered-matter removing means includes means for blowing an inert gas. More specifically, a blowing nozzle 134G connected to a He gas bomb 133G is disposed in the treating chamber 130G to open adjacent the surface of the printed circuit board 100G. Above the printed circuit board 100G, there are provided the same exhaust suction port 131G connected to the vacuum pump 132G as those in the above described embodiment of FIG. 27. Thus, while irradiating the laser beam R onto the surface of the printed circuit board 100G, He gas is blown out of the nozzle 134G. The thus blow He as is first caused to flow along the surface of the board 100G and is then drawn upward to be sucked into the port 131G. The scattered matter occurred from the surface of the board 100G is carried by this He gas flow and is eventually exhausted through the suction port 131G to the exterior. Since He gas is inert, no affection is given to the surface of the conductor parts or the like with which the gas has contacted.

Figure 29:
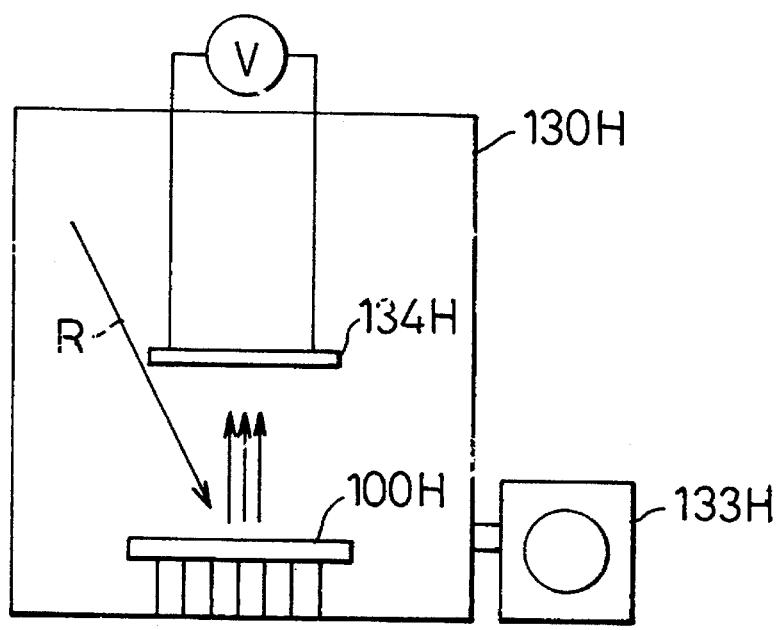

In another embodiment of the present invention shown in FIG. 29, a heating member is employed as the scattered matter removing means. More specifically, a heater 134H in the form of a metal plate which generates heat when an electric current is made to flow therethrough is disposed above the printed circuit board 100H within the treating chamber 130H and, in operation, the heater 134H is made to have a surface temperature above 500° C. The scattered matter from the surface of the printed circuit board 100H upon irradiation of the laser beam R is to be immediately heated when contacted with the heater 134H to be gasified, and the scattered matter thus gasified is caused to be discharged out of the treating chamber 130H with the operation of the vacuum pump 133H. The surface temperature of the heater 134H may just be above a vaporization temperature of constituting resin or the like of the scattered matter, but it is desirable that the surface temperature is maintained at such temperature level as in the above in order that the scattered matter can be gasified reliably in a short time upon contact. It is also possible to catch the scattered matter by mounting, in place of the above heater 134H, an electrified body, viscous member, absorbent or the like, while in this case the scattered matter cannot be gasified and it is required to provide means for taking the scattered matter caught by the electrified body or the like out of the chamber.

Figure 30:
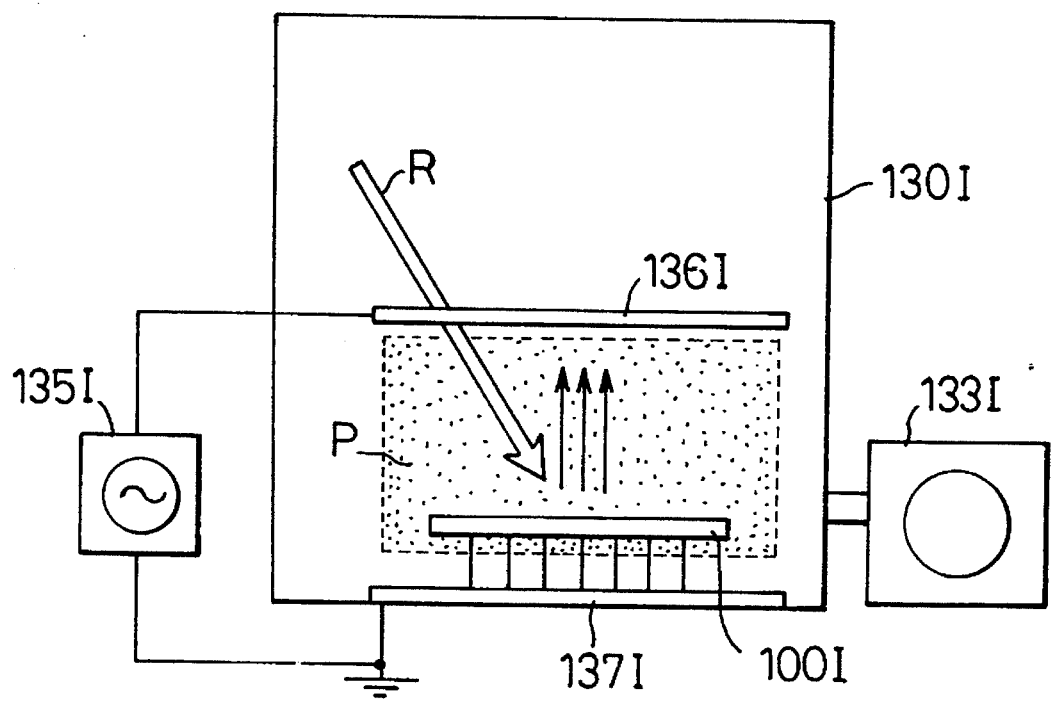

In another embodiment of the present invention shown in FIG. 30, the process is adapted to perform a plasma treatment. More specifically, a pair of plate-shaped electrodes 136I and 137I are disposed to oppose respectively at a position above the printed circuit board 100I to face the same and at a position of mounting the board 100I to be below the same, while these electrodes 136I and 137I are connected to a high frequency power source 135I disposed outside the treating chamber 130I. This high frequency power source 135I provides an output of 100W, for example. The vacuum pump 133I is provided for vacuuming the interior of the treating chamber 130I to be about 0.1 Torr, while supplying therein Ar or the like plasma gas, a voltage is applied from the high frequency power source 135I to the electrodes 136I and 137I, and a plasma can be generated in the space between the electrodes. In this state where this plasma atmosphere P is present, the laser beam R is irradiated onto the printed circuit board 100I, the scattered matter from the printed circuit board 100I is carried by the plasma P and can be prevented from adhering again to the surface of the conductor parts of the printed circuit board 100I in smooth manner.

Figure 31:
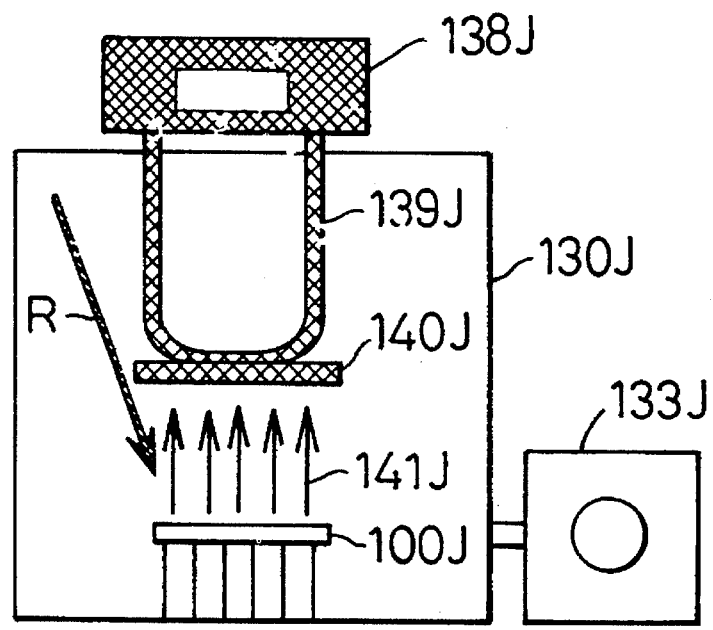

In another embodiment shown in FIG. 31 of the present invention, a cooling member is employed as the scattered matter removing means. Thus, within the vacuum treating chamber 130J, a cooler 140J made of an excellent heat conductivity and cooled by means of liquified nitrogen is disposed above the printed circuit board 100J. The cooler 140J has a surface opposed to the printed circuit board 100J, and is provided for circulating the liquified nitrogen between a reservoir means 138J through a piping 139J and the cooler 140J so that the latter can be sequentially cooled. The surface of the cooler 140J is cooled by such cooling medium as the liquified nitrogen to be below 0° C., while the interior of the treating chamber 130J is made to be the vacuumed atmosphere by means of the vacuum pump 133J. The scattered matter 141J occurring upon irradiation of the laser beam R onto the printed circuit board 100J is scattered upward to be cooled by and adsorbed to the cooler 140J. Thus, the cooler 140J is so disposed as to have the scattered matter 141J caused to jump from the printed circuit board towards the cooler 140J.

It is preferable to employ, as the cooler 140J, a copper-made circular disk, and to arrange it optimumly to be cooled to be about −170° C. For the cooling medium, the liquified nitrogen has been referred to as an example, but a liquified oxygen, liquified helium or the like may also be effectively employed. In an event where the cooling temperature is insufficient to be so high as to have no difference from the atmospheric temperature of the treating chamber, the effect of catching the scattered matter is deteriorated.

Figure 32:
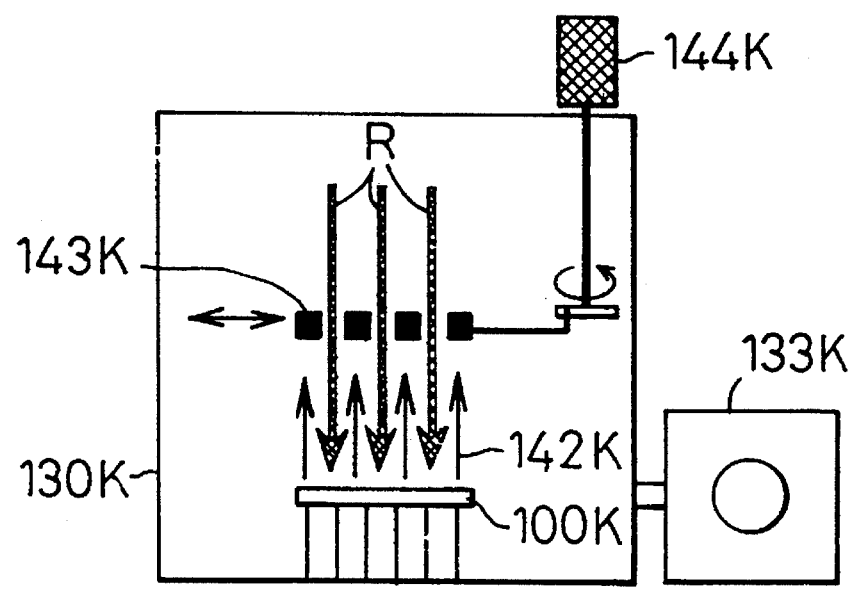

In another embodiment shown in FIG. 32 of the present invention, a mesh-type catcher 143K is employed as the scattered matter removing means. More specifically, in the present embodiment, a metallic mesh catcher 143K is disposed within the vacuumed treating chamber 130K to oppose from above the printed circuit board 100K and to be within irradiation path of the laser beam R. At the time when the laser beam R passes through the metallic catcher 143K, the beam is partly reflected by the catcher 143K so as not to reach the printed circuit board 100K and, in order to avoid this, the catcher 143K is vibrated in lateral directions, for example. The scattered matter from the printed circuit board 100K upon irradiation thereon of the laser beam R is to be caught by the metallic mesh catcher 143K. While it is preferable to form the metallic mesh catcher 143K with copper, any other metal will be employable. Even glass or fibrous ceramics will also be effectively employable. Further, the metallic mesh catcher 143K should preferably be periodically cleaned by, for example, dipping the catcher in an organic solvent and oscillating the solvent with a supersonic wave applied to the solvent. When the metallic mesh catch 143K has deteriorated, it should be exchanged with new one. In addition, the vibration of the catcher 143K is realized practically by means of a motor 144K including an eccentric cam, which executes the vibration at an amplitude of 3 mm and a frequency of 1 kHz.

Figure 33:
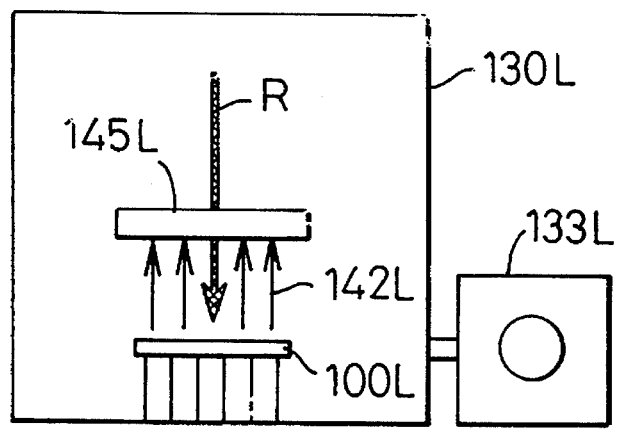

In another embodiment shown in FIG. 33, the scattered matter removing means comprises an energy beam transmitting member. In the present embodiment, a plate-shaped synthetic quartz 145L is employed as the laser beam transmitting member, and this synthetic quartz 145L has more than 95% of the transmission with respect to the EXIMER laser, and is disposed within the treating chamber 130L to be above the conductor parts on the printed circuit board 100L. At this time, the longer the distance between the printed circuit board 100L and the synthetic quartz 145 the more the scattered matter scattered, so that there may arise a risk that the synthetic quartz is required to be larger in size so as to include an ineffective part and, when the quartz 145L comes closer to the printed circuit board 100L, the density of the laser beam R is made higher, so that the synthetic quartz 145L will be damaged to have the transmission of the laser beam R deteriorated. For this reason, the present embodiment disposes the synthetic quartz 145L at a distance of 30 mm from the printed circuit board 100L. When the conductor parts of the printed circuit board 100L are within an area of 20×20 mm, the synthetic quartz 145L of 70 mm$\phi$ will be employed. The scattering of the scattered matter 142L can be thereby substantially restrained, and almost all of the scattered matter can be made to adhere to the synthetic quartz 145L. The scattered matter is partly gasified, and the gasified matter can be sucked and discharged by the vacuum pump 133L used for achieving the vacuumed atmosphere within the chamber 130L. In place of the foregoing synthetic quartz, $MgF_2$ and $CaF_2$ will be similarly employable.

Figure 34A:
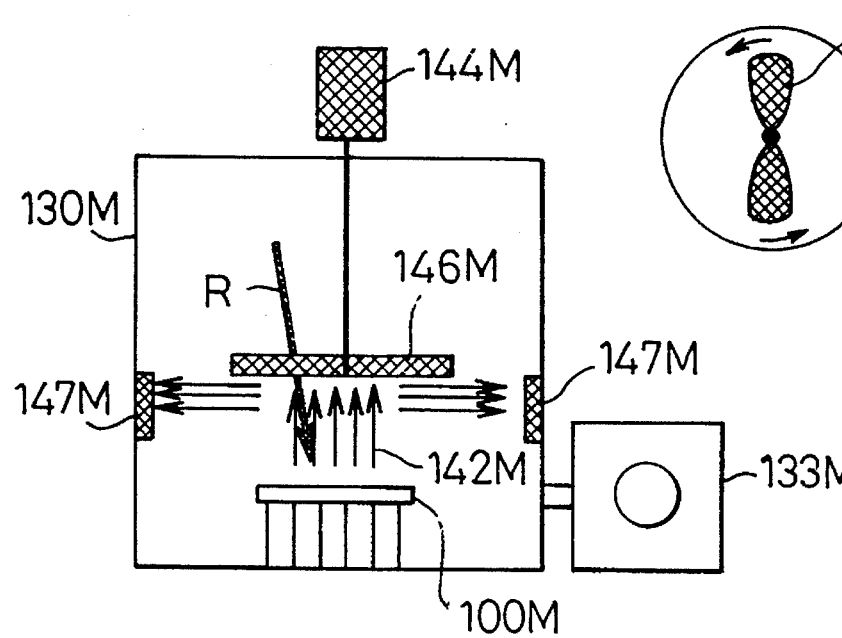
Figure 34B:
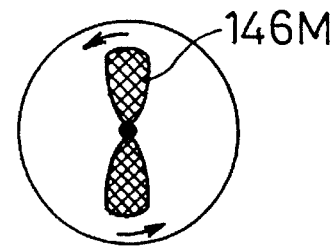

In still another embodiment of the present invention shown in FIG. 34, a rotary member 146M is disposed above the printed circuit board 100M within the treating chamber 130M, so that the scattered matter 142M will be caused to collide with this rotary member 146M to fly in different directions from the direction in which the matter has scattered from the board 100M, and to be caught by a catch means 147M for the scattered matter in that different direction. The rotary member 146M is driven for such rotary operation by a motor 144M provided outside the treating chamber 130M. For the catch means 147M, an air discharge means, heater, cooler, viscous member, electrified member or the like may be effectively employed. Further, the rotary member 146M should preferably be formed in such vane structure as shown in FIG. 34B in which vanes extend in opposition directions, in order to avoid intercepting the laser beam R.

Figure 35:
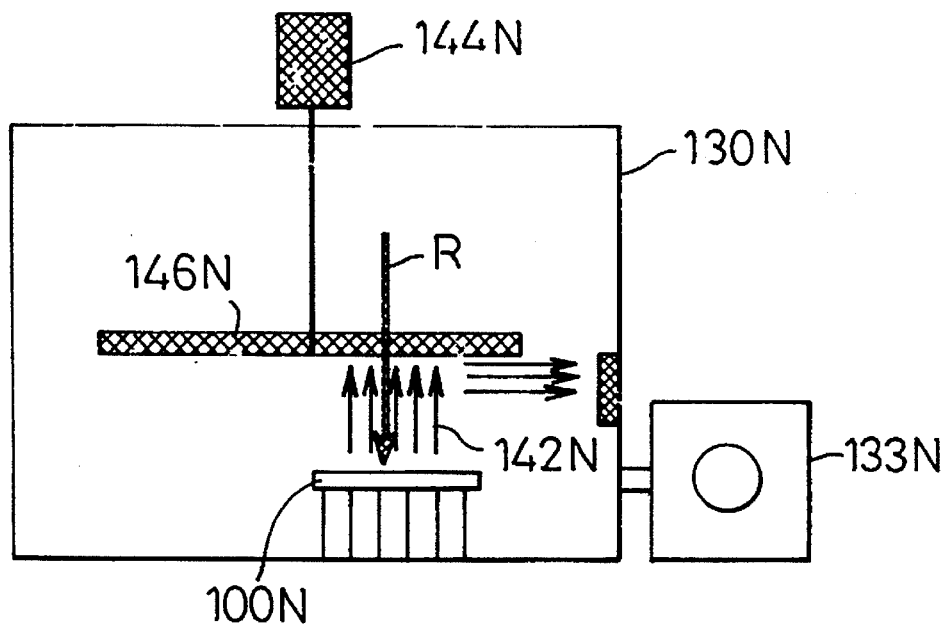

In another embodiment of the present invention shown in FIG. 35, the rotary member 146N rotated by the motor 144N is disposed to have the rotary center deviated from a position right above the center of the printed circuit board 100N, in contrast to the embodiment of FIG. 34, whereby the scattered matter 142N occurring upon irradiation of the laser beam R will be caused to fly substantially in such single direction as shown by arrows in the drawing, and the disposition of the catching means can be simplified.

Figure 36:
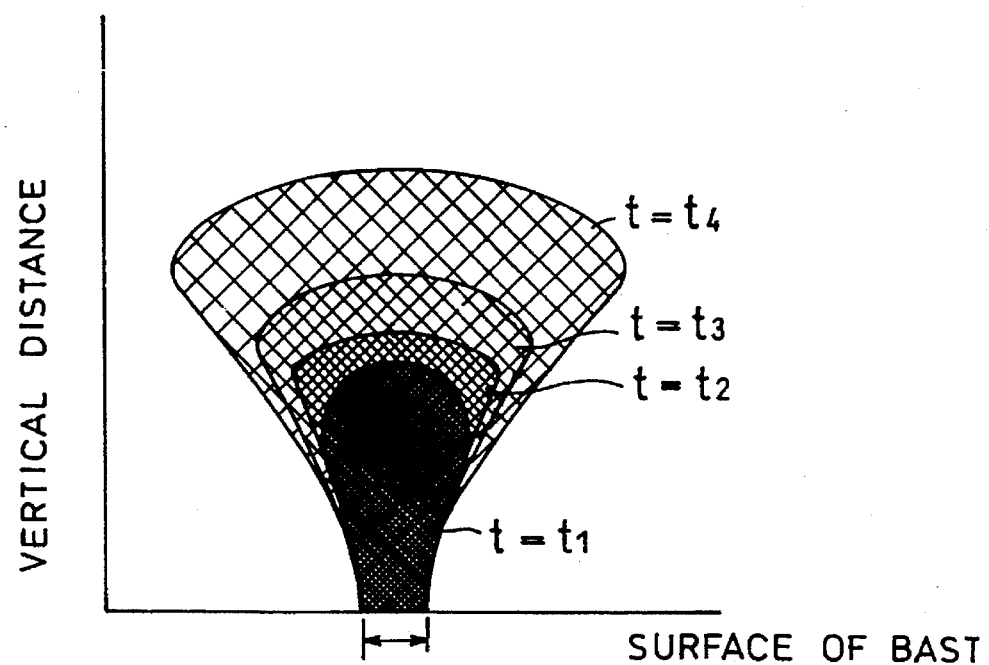
FIG. 36 is an explanatory diagram for scattered substance occurring in the embodiment of FIG. 35.
Figure 37:
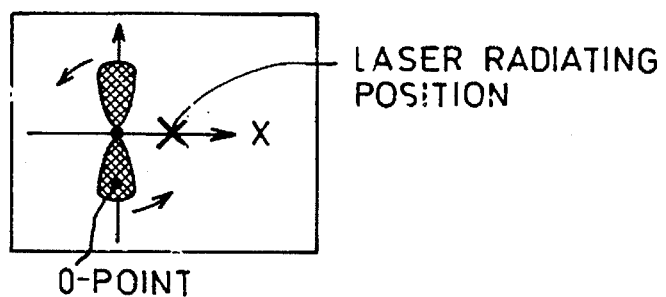
FIG. 37 is an explanatory diagram for laser irradiating position and an operation of rotary member in the embodiment of FIG. 35.
Figure 38:
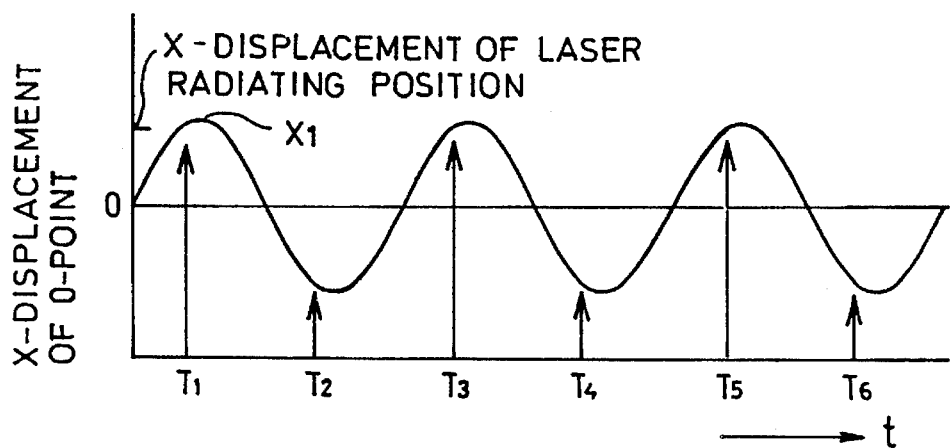
FIGS. 38 and 39 are explanatory views for further and different embodiments of the present invention.

Generally, the scattered matter is expanded increasingly with sequential time $t_1$, $t_2$, $t_3$ and $t_4$ passed ($t_1<t_2<t_3<t_4$), as shown in FIG. 36. By controlling the scattering range of the scattered matter and the timing at which the rotary member passes through the scattering range, therefore, it is possible to cause the scattered matter more effectively collide with the rotary member. The timing at which the irradiating position of the laser beam R is passed through by each of such axially symmetrical two vanes as shown in FIG. 37 of the rotary member is graphically shown in FIG. 38, in which X-displacement at 0-point of the vane of the rotary member with time is shown. As will be clear from the drawings, the laser beam R can be irradiated onto the printed circuit board without being intercepted by the rotary member at each timing $t_1, t_2, t_3, t_4, t_5, t_6, \ldots$ immediately before (several hundreds n.sec. before) the timing $x_1$ at which the rotary member passes above the irradiating position of the laser beam R.

Figure 39:
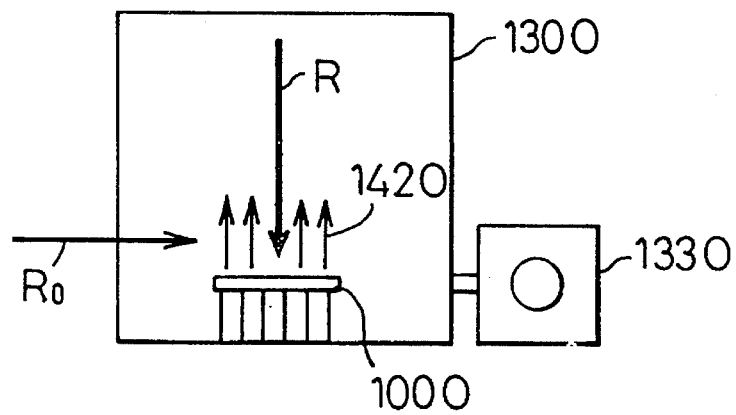
Figure 40:
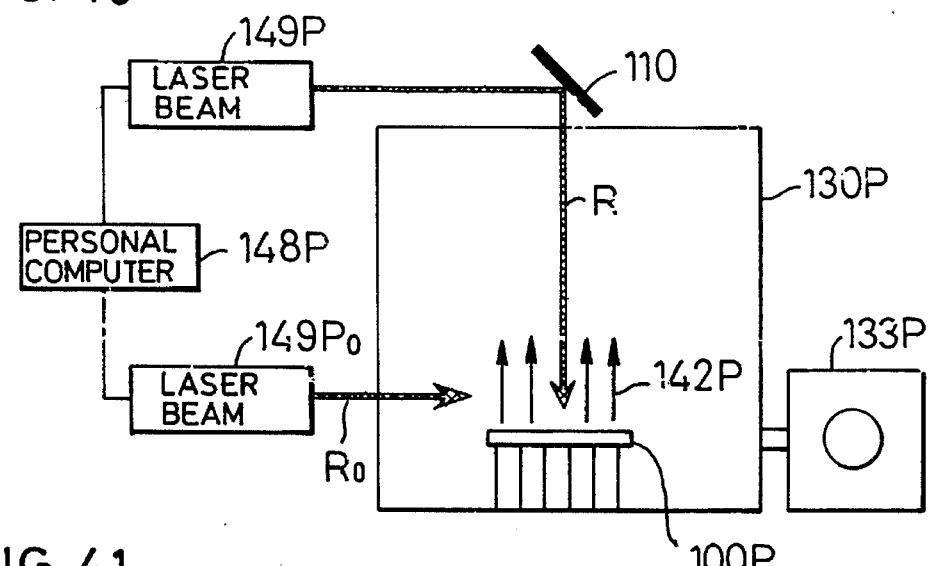
FIG. 40 is a timing chart of the laser irradiation in the embodiment of FIG. 39.

In another embodiment shown in FIG. 39 of the present invention, the scattered matter 142O is to be gasified or finely divided by means of a further laser beam irradiated transversely the scattered matter in upward direction from the printed circuit board. In this case, another laser beam Ro is irradiated in, for example, horizontal direction onto the scattered matter 132O occurring in upward direction from the printed circuit board 100O upon irradiation of the laser beam R within the treating chamber 130O to which the vacuum pump 133O is connected. The scattered matter 143O can be thereby gasified or at least finely divided even could not be gasified, so as to be minimized in weight so as to increase the fluidity, and the vacuum pump 133O can easily suck and discharge the scattered matter. For another laser beam Ro, an infrared laser, carbon dioxide laser, YGA laser, ultraviolet laser or the like may be employed.

Figure 41:
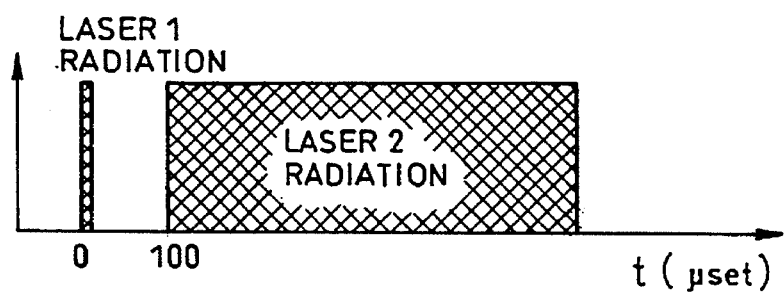
FIGS. 41 through 45 are explanatory views for further and different embodiments according to the present invention.

In another embodiment of the present invention shown in FIG. 30, there is taken a measure for controlling the timing of the irradiating time of the laser beam R for use in the surface treatment of the printed circuit board 100P within the treating chamber 130P and the irradiating time of another laser beam Ro for use in gasifying and finely dividing the scattered matter 142P. Since the scattered matter 142P from the printed circuit board 100P increases generally after a fixed time from initiation of the irradiation of laser beam R, the irradiation of another laser beam Ro for the gasification and fine division of the scattered matter is started as delayed by 0.1 to 1 m.sec. from the initiation of irradiating the laser beam R for the surface treatment of the printed circuit board 100P. In the present embodiment, a personal computer 148P controls the irradiating timing and time of the laser beam source 149P for the surface treatment and of the laser beam source 149Po for the gasifying and finely dividing the scattered matter 142P. The laser beam R for the surface treatment is irradiated as deflected properly by means of a mirror 110P, if required. In the present embodiment, as shown in FIG. 41, the surface treating laser beam R as a first laser beam is irradiated in a pulse shape, and the gasifying and finely dividing laser beam Ro as a second laser beam is irradiated as delayed by 1/100 μsec. for a relatively long time.

Figure 42:
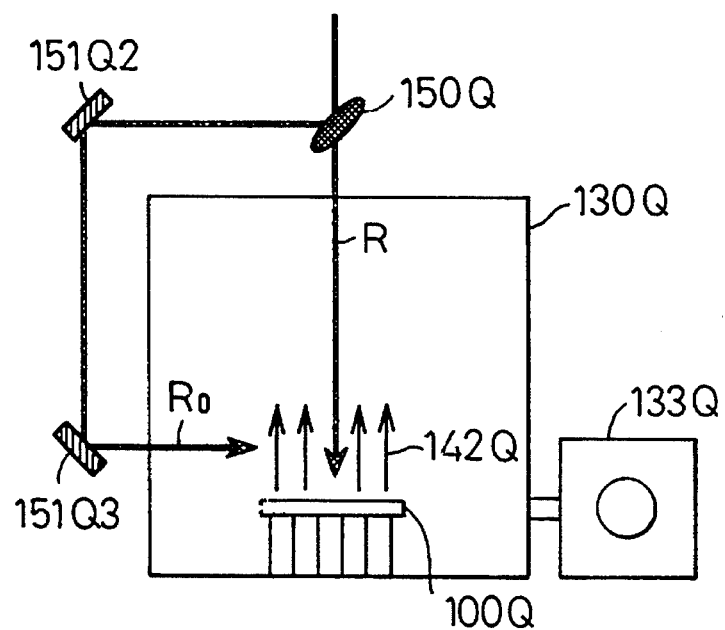

In another embodiment of the present invention shown in FIG. 42, a single laser beam is utilized as branched into the surface treating laser beam R and the gasifying and finely dividing laser beam Ro with respect to the scattered matter. In this case, the length of branched light path is so regulated that the initiating time of irradiation of the gasifying and finely dividing laser beam Ro can be controlled with respect to the surface treating laser beam R.

Figure 43:
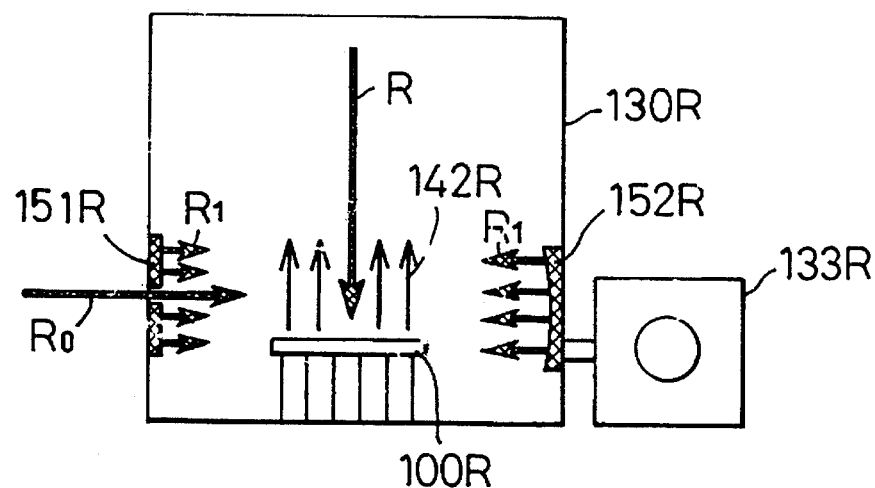

In another embodiment of the present invention shown in FIG. 43, a pair of mirrors 151R and 152R disposed as oppposed to each in the treating chamber 130R on both sides of the scattered matter 142R cause reflected beams R1 sequentially to occur from the gasifying and finely dividing laser beam Ro, and to be irradiated at a high efficiency onto the scattered matter 142R from the printed circuit board. According to the present embodiment, therefore, the gasification and fine division of the scattered matter can be more sufficiently achieved.

Figure 44:
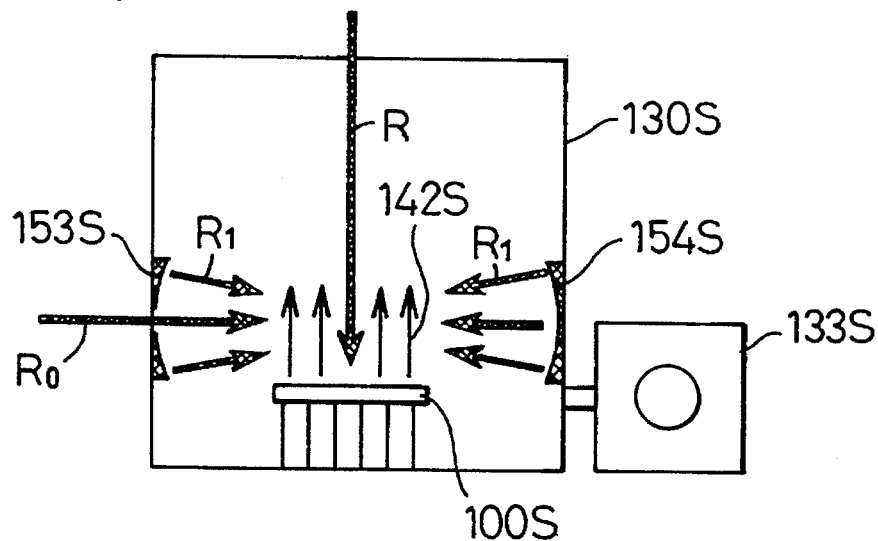

In another embodiment of the present invention shown in FIG. 44, the mirrors disposed as opposed in the treating chamber 130S comprise concave lenses 153S and 154S which are effective to render the sequentially occurring reflected beams R1 from the gasifying and finely dividing laser beam Ro to be more improved because the reflected beams R1 are made to converge towards the center of the scattered matter from the printed circuit board 100S, so that the density of energy in the converged zone for improving the gasifying and finely dividing action.

Figure 45:
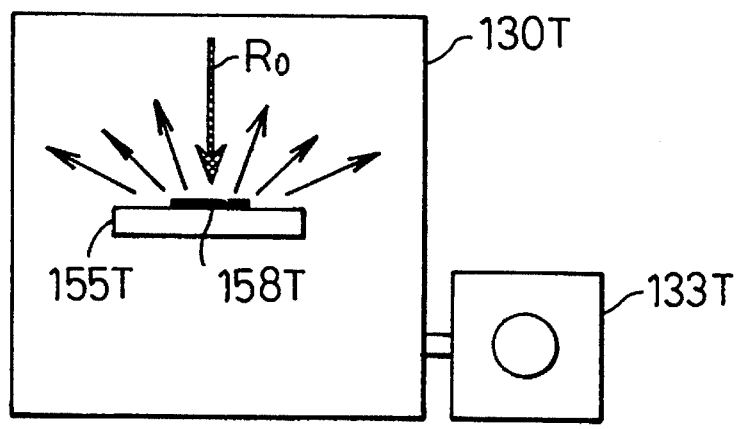

In still another embodiment of the present invention shown in FIG. 45, the gasifying and finely dividing laser beam Ro with respect to the scattered matter is irradiated onto the scattered matter 158T caught on the catch means 155T disposed above the printed circuit board (not shown here), so that the scattered matter 158T can be gasified and finely divided so as to be moved as fluidized from the catch means 155T, as being prevented from adhering again on the printed circuit board, and to be sucked and discharged by the action of the vacuum pump, for example.

Figure 46:
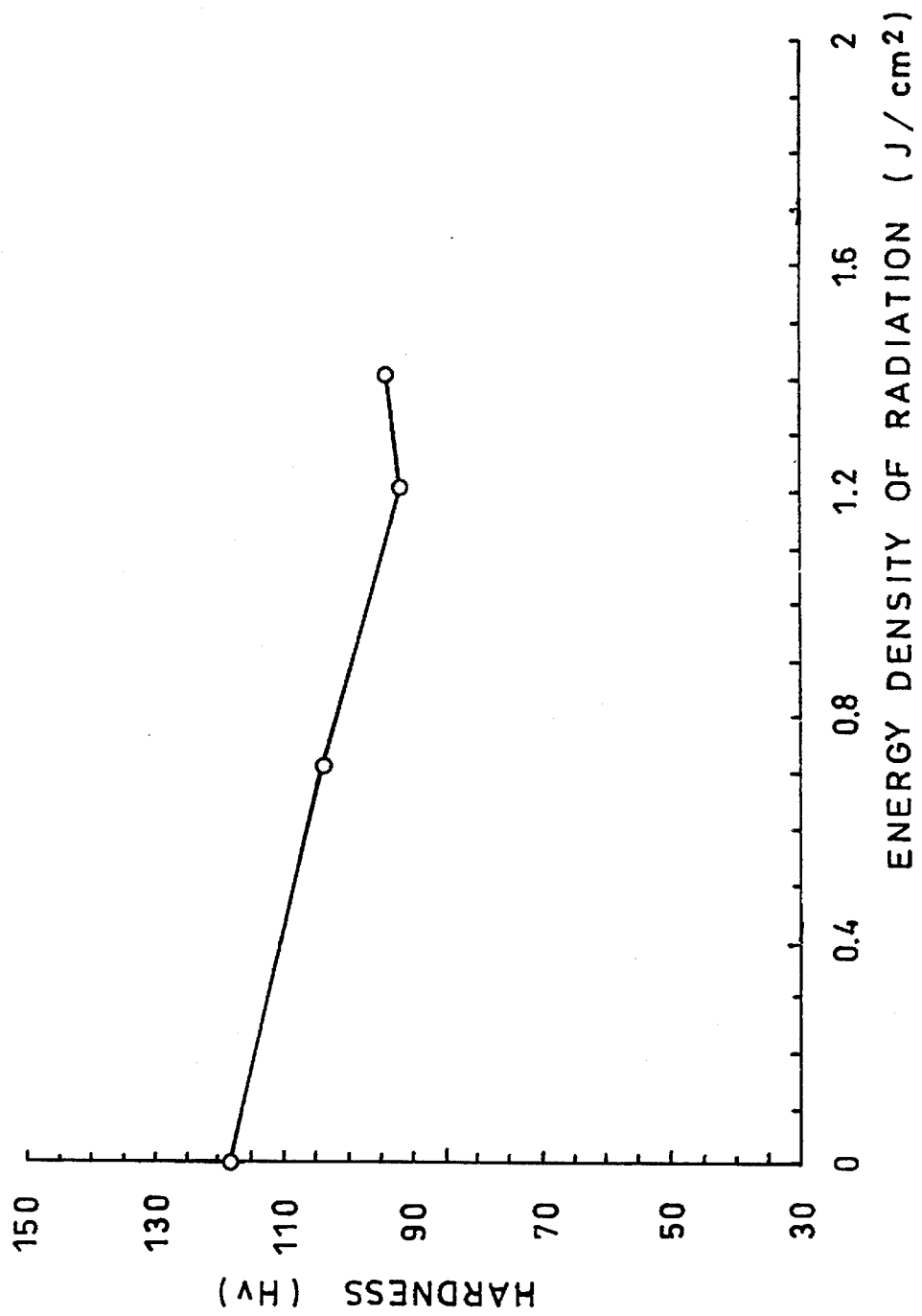
FIG. 46 is a graph showing the relationship of the hardness to the density of energy at the conductor parts after being treated of the printed circuit board according to the present invention.

Referring to FIG. 46, measurement of Vickers hardness with respect to the density of energy of the irradiated laser beam for four times for 20 n.sec. onto Au layer provided to be 0.5 μm thick on the conductor parts of the printed circuit board is represented graphically, from which it should be appreciated that the higher the density of irradiation of softer the Au layer as the conductor part.

In the foregoing embodiments shown in each of FIGS. 19–24, in FIGS. 25 and 26, each of FIGS. 27–35, in FIGS. 37 and 38, FIG. 39, FIGS. 40 and 41, and each of FIGS. 41–45, all other arrangements and consituents are the same as those described with reference to FIG. 18 and FIGS. 1–3, and, in the respective 21 embodiments shown in FIG. 19 and followings, the same constituent elements are denoted by the same reference numerals as those used in FIG. 18 and FIGS. 1–3 but with "100" as well as alphabets A–T added, and are effective to obtain the same function and effect as those in respective preceding embodiments.

What is claimed is:

1. A surface treating process with energy beam irradiation onto multilayered conductor parts on a printed circuit board, the process comprising the steps of:

forming, on a substrate of an organic material for said printed circuit board, said conductor parts each comprising a lamination of a plurality of layers of different metal materials; and irradiating an energy beam onto a surface of said conductor parts under such irradiating conditions that the conductor parts are subjected to a surface treatment for once melting only the topmost surface part of a top layer of said plurality of layers of the conductor parts, the melting stopping short of a next layer of another metal material in the lamination, to thus avoid forming any alloy between adjacent layers of said lamination.

2. The process according to claim 1 wherein, as said energy beam irradiating conditions, one of wavelength of the energy beam, the density of energy, the number of shot, irradiating time, pulse width and peak power is set in accordance with material characteristics including the thickness, heat conduction and threshold value with respect to said energy beam of said top metal material layer of the conductor parts.

3. The process according to claim 1 wherein said energy beam irradiating conditions are controlled in response to a result of observation at least of surface state of the conductor parts among the conductor parts and their adjacent portions at the time when the energy beam is irradiated.

4. The process according to claim 1 wherein said energy beam irradiation is carried out under a vacuumed atmosphere.

5. The process according to claim 4 which further comprises the steps of preparing a treating chamber of said vacuumed atmosphere, housing said printed circuit board in said treating chamber, irradiating said energy beam onto the printed circuit board within the treating chamber through a window provided to the treating chamber to be permeable only to the energy beam, and supervising the state of contamination of said permeable window of the treating chamber.

6. The process according to claim 4 which further comprises the step of supervising any mixing of impurities in said vacuumed atmosphere, through measurement of gas composition in the vacuumed atmosphere.

7. The process according to claim 4 which further comprises the step of supervising any mixing of impurities in said vacuumed atmosphere, through measurement of transmission of said laser beam in the vacuumed atmosphere.

8. The process according to claim 4 which further comprises the step of supervising any mixing of impurities in said vacuumed atmosphere, through measurement of luminous amount of plasma generated upon irradiation of said energy beam in the vacuumed atmosphere.

9. The process according to claim 4 which further comprises the step of supervising any mixing of impurities in said vacuumed atmosphere, through detection of pressure variation in the vacuumed atmosphere.

10. The process according to claim 1 which further comprises the step of evaluating the result of surface treatment through an inspection of surface characteristics at said conductor parts of said printed circuit board.

11. The process according to claim 1 which further comprises the step of, prior to said step of forming the conductor parts on the substrate, forming a surface zone of said substrate to be subjected to said energy beam irradiation, including positions where said conductor parts are formed, of a second organic material having a higher melting temperature than said organic material forming other zones of the substrate which are not subjected to the energy beam irradiation.

12. The surface treating process according to claim 1, wherein said irradiating step comprises melting only said topmost part of a final layer of said lamination defined by said top layer.

13. The surface treating process according to claim 12, wherein said irradiating step comprises melting only said topmost surface part of a noble metal defining said final layer.

14. The surface treating process according to claim 12, wherein said irradiating step comprises melting only said topmost surface part of a layer of gold defining said final layer.

15. A surface treating process with energy beam irradiation onto multilayered conductor parts on a printed circuit board, the process comprising the steps of:

forming, on a substrate of an organic material for said printed circuit board, said conductor parts each comprising a lamination of a plurality of layers of different metal materials; and irradiating an energy beam, through a transmission part of a shield plate, onto a surface of said conductor parts under such irradiating conditions that the conductor parts are subjected to a surface treatment by said energy beam for once melting only the topmost surface zone of a top layer of said plurality of layers of the conductor parts without forming any alloy between adjacent layers of said lamination.

16. The process according to claim 15 which further comprises a step of forming said transmission part in said shield plate by irradiating the energy beam onto the shield plate prior to said irradiation of the beam onto said conductor parts.

17. The process according to claim 15 which further comprises a step of, prior to said energy beam irradiating step, bringing said shield plate on said conductor parts with said transmission part of the shield plate aligned in position of formed pattern of the conductor parts, and into close contact with the surface of the conductor parts with an inert gas blown over the shield plate against the conductor parts.

18. The process according to claim 15 wherein said energy beam irradiating step includes a step of placing a beam shaping means between an energy beam irradiating means and said shield plate for irradiating a shaped energy beam.

19. The process according to claim 15 wherein said energy beam irradiating step is performed by irradiating the energy beam onto the surface of the conductor parts at an angle of inclination with respect to vertical direction of the surface of the conductor parts.

20. The process according to claim 15 wherein said energy beam irradiating step is performed with respect to a zone wider than the surface zone of the conductor part, while placing the printed circuit board in a vacuumed atmosphere.

21. The process according to claim 20 wherein said energy beam irradiating step includes steps of placing the printed circuit board on which said conductor parts are formed in a treating space under an atmospheric pressure, and vacuuming said treating space to obtain a vacuumed atmosphere, said energy beam irradiation being performed at the time when the pressure in the treating chamber has become less than 0.1 Torr.

22. The process according to claim 20 wherein said vacuumed atmosphere is of an inert gas atmosphere.

23. The process according to claim 20 wherein said laser beam irradiating step includes a step of removing scattered matter occurring from said substrate to prevent said scattered matter from adhering to the surface of the conductor parts.

24. The process according to claim 23 wherein said scattered matter removing is carried out by sucking and discharging a gas containing the scattered matter at a zone adjacent to said substrate.

25. The process according to claim 23 wherein said scattered matter removing is carried out by blowing an inert gas to a zone where said energy beam is irradiated, and sucking a gas flow occurred by said blowing together with the inert gas for discharging the same.

26. The process according to claim 23 wherein said scattered matter removing is carried out by disposing a heater means to be close to said substrate for heating and evaporating the scattered matter.

27. The process according to claim 23 wherein said scattered matter removing is carried out by disposing an electrified body adjacent to said substrate for attracting and catching the scattered matter electrified.

28. The process according to claim 23 wherein said scattered matter removing is carried out by disposing a viscous member adjacent to said substrate for catching the scattered matter with the viscousness.

29. The process according to claim 23 wherein said scattered matter removing is carried out by disposing an absorbing member adjacent to said substrate for absorbing and catching the scattered matter.

30. The process according to claim 20 wherein said energy beam irradiating step includes a step of exposing the surface of said conductor parts to a plasma atmosphere at least upon the irradiation in a period from the irradiation and after the irradiation of the energy beam.

31. The process according to claim 23 wherein said scattered matter removing is carried out by disposing a cooling member adjacent to said substrate for cooling and catching the scattered matter.

32. The process according to claim 23 wherein said scattered matter removing is carried out by disposing a mesh type collector adjacent to said substrate, and vibrating said collector for catching the scattered matter while simultaneously allowing the energy beam to pass the collector.

33. The process according to claim 23 wherein said scattered matter removing is carried out by disposing a member permeable to said energy beam adjacent to said substrate for absorbing and catching the scattered matter by said permeable member.

34. The process according to claim 23 wherein said scattered matter removing is carried out by disposing a rotary member adjacent to said substrate, rotating said rotary member to change flying direction of the scattered matter collided with the rotating rotary member for catching the scattered matter in said changed direction.

35. The process according to claim 34 wherein said catching of said scattered matter is performed with irradiating time of the energy beam and the position of said rotary member controlled.

36. The process according to claim 35 wherein said scattered matter catching is performed by further irradiating the energy beam onto the scattered matter in flying path.

37. The process according to claim 36 wherein said catching of said scattered matter is carried out by also controlling irradiating time of said energy beam irradiation onto the scattered matter in said flying path.

38. The process according to claim 36 wherein said scattered matter catching is performed by disposing mirrors on both sides of said flying path of the scattered matter for reflecting said further energy beam irradiated between said mirrors.

39. The process according to claim 23 wherein said scattered matter catching is performed by irradiating the energy beam onto the scattered matter with irradiating time of the energy beam made optimum.

40. The surface treating process according to claim 15, wherein said irradiating step comprises melting only said topmost part of a final layer of said lamination defined by said top layer.

41. The surface treating process according to claim 40, wherein said irradiating step comprises melting only said topmost surface part of a noble metal defining said final layer.

42. The surface treating process according to claim 40, wherein said irradiating step comprises melting only said topmost surface part of a layer of gold defining said final layer.

* * * * *

UNITED STATES PATENT AND TRADEMARK OFFICE
CERTIFICATE OF CORRECTION

PATENT NO.  : 5,601,737
DATED       : February 11, 1997
INVENTOR(S) : Nobuyuki Asahi; Jun Tatsuta It is certified that error appears in the above-indentified patent and that said Letters Patent is hereby corrected as shown below:

Title page, under item [56], Foreign Patent Documents:

" 0144013 9/1980 JAPAN " should be
-- 0144013 9/1980 GERMANY --

Signed and Sealed this

Twenty-ninth Day of April, 1997

Attest:

BRUCE LEHMAN

Attesting Officer

Commissioner of Patents and Trademarks